US010163771B2

(12) United States Patent
Zuo et al.

(10) Patent No.: US 10,163,771 B2
(45) Date of Patent: Dec. 25, 2018

(54) INTERPOSER DEVICE INCLUDING AT LEAST ONE TRANSISTOR AND AT LEAST ONE THROUGH-SUBSTRATE VIA

(71) Applicant: QUALCOMM Incorporated, San Diego, CA (US)

(72) Inventors: Chengjie Zuo, San Diego, CA (US); Changhan Hobie Yun, San Diego, CA (US); David Francis Berdy, San Diego, CA (US); Niranjan Sunil Mudakatte, San Diego, CA (US); Mario Francisco Velez, San Diego, CA (US); Shiqun Gu, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/231,512

(22) Filed: Aug. 8, 2016

(65) Prior Publication Data

US 2018/0040547 A1    Feb. 8, 2018

(51) Int. Cl.
*H01L 23/498* (2006.01)
*H01L 23/538* (2006.01)
*H01L 25/065* (2006.01)
*H01L 25/07* (2006.01)
*H01L 25/11* (2006.01)
*H01L 25/00* (2006.01)
(Continued)

(52) U.S. Cl.
CPC ...... *H01L 23/49827* (2013.01); *H01L 23/481* (2013.01); *H01L 23/49833* (2013.01); *H01L 23/5384* (2013.01); *H01L 25/0657* (2013.01); *H01L 25/074* (2013.01); *H01L 25/117* (2013.01); *H01L 25/50* (2013.01); *H01L 27/092* (2013.01); *H01L 28/10* (2013.01); *H01L 28/40* (2013.01); *H01L 2224/08146* (2013.01); *H01L 2224/80895* (2013.01); *H01L 2224/80896* (2013.01); *H01L 2225/06572* (2013.01)

(58) Field of Classification Search
CPC ............ H01L 23/49827; H01L 27/092; H01L 25/117; H01L 25/074; H01L 25/0657; H01L 23/5384; H01L 23/49833; H01L 25/50; H01L 28/10; H01L 28/40
See application file for complete search history.

(56) References Cited

U.S. PATENT DOCUMENTS 4,111,557 A * 9/1978 Rottenkolber ..... G01B 11/2441
356/394
5,445,996 A * 8/1995 Kodera ................ B24B 37/013
257/E21.243
(Continued)

OTHER PUBLICATIONS

International Search Report and Written Opinion—PCT/US2017/041575—ISA/EPO—dated Oct. 2, 2017.

*Primary Examiner* — Fei Fei Yeung Lopez
(74) *Attorney, Agent, or Firm* — Toler Law Group, PC.

(57) ABSTRACT

In a particular aspect, a device includes a substrate including at least one through-substrate via. A metal structure is disposed on a surface of the substrate. The device further includes a semiconductor layer bonded to the substrate. The semiconductor layer includes at least one complimentary metal-oxide-semiconductor (CMOS) transistor and a metal disposed within a second via. The metal is in direct contact with the metal structure.

22 Claims, 12 Drawing Sheets

(51) Int. Cl.
*H01L 27/092* (2006.01)
*H01L 49/02* (2006.01)
*H01L 23/48* (2006.01)

(56) References Cited

U.S. PATENT DOCUMENTS

| | | | | |
|---|---|---|---|---|
| 5,728,591 A | * | 3/1998 | Takahashi | G02F 1/13454 148/DIG. 12 |
| 6,078,825 A | * | 6/2000 | Hahn | H04B 1/3877 379/185 |
| 7,808,798 B2 | | 10/2010 | Cotte et al. | |
| 7,841,080 B2 | | 11/2010 | Muthukumar et al. | |
| 8,344,512 B2 | | 1/2013 | Knickerbocker | |
| 8,866,275 B2 | | 10/2014 | Camacho et al. | |
| 9,214,433 B2 | | 12/2015 | Xiang et al. | |
| 2002/0049038 A1 | * | 4/2002 | Sorrells | H03D 7/00 455/22 |
| 2004/0000701 A1 | * | 1/2004 | White | H01F 17/0006 257/664 |
| 2004/0157407 A1 | * | 8/2004 | Tong | B23K 20/02 438/455 |
| 2004/0229444 A1 | * | 11/2004 | Couillard | H01L 21/2007 438/455 |
| 2005/0176403 A1 | * | 8/2005 | Lalos | G08B 25/016 455/404.1 |
| 2006/0091543 A1 | * | 5/2006 | Lee | H01L 23/49811 257/738 |
| 2006/0202269 A1 | * | 9/2006 | Suzuki | H01L 21/84 257/347 |
| 2007/0090510 A1 | * | 4/2007 | Tseng | H01L 33/641 257/690 |
| 2009/0008669 A1 | * | 1/2009 | Maeda | G02B 26/0841 257/98 |
| 2009/0160050 A1 | * | 6/2009 | Miyakawa | H01L 21/76898 257/737 |
| 2010/0216410 A1 | * | 8/2010 | Liu | H04B 1/38 455/73 |
| 2011/0186936 A1 | * | 8/2011 | Iwamatsu | H01L 21/76898 257/393 |
| 2013/0062737 A1 | * | 3/2013 | Hongo | H01L 27/14636 257/622 |
| 2013/0207745 A1 | * | 8/2013 | Yun | H03H 7/1708 333/185 |
| 2013/0249003 A1 | * | 9/2013 | Oh | H01L 21/845 257/347 |
| 2013/0295727 A1 | * | 11/2013 | Hsu | H01L 23/49827 438/130 |
| 2014/0247269 A1 | | 9/2014 | Berdy et al. | |
| 2014/0361856 A1 | * | 12/2014 | Leipold | H03H 7/0115 333/24 C |
| 2014/0369573 A1 | * | 12/2014 | Chiu | G06K 9/00013 382/124 |
| 2015/0035162 A1 | | 2/2015 | Lan et al. | |
| 2015/0092314 A1 | | 4/2015 | Kim et al. | |
| 2015/0171050 A1 | | 6/2015 | Chen et al. | |
| 2015/0270209 A1 | | 9/2015 | Woychik et al. | |
| 2015/0289360 A1 | * | 10/2015 | Leong | H01L 23/5221 361/782 |
| 2017/0047312 A1 | * | 2/2017 | Budd | G02B 6/4204 |

* cited by examiner

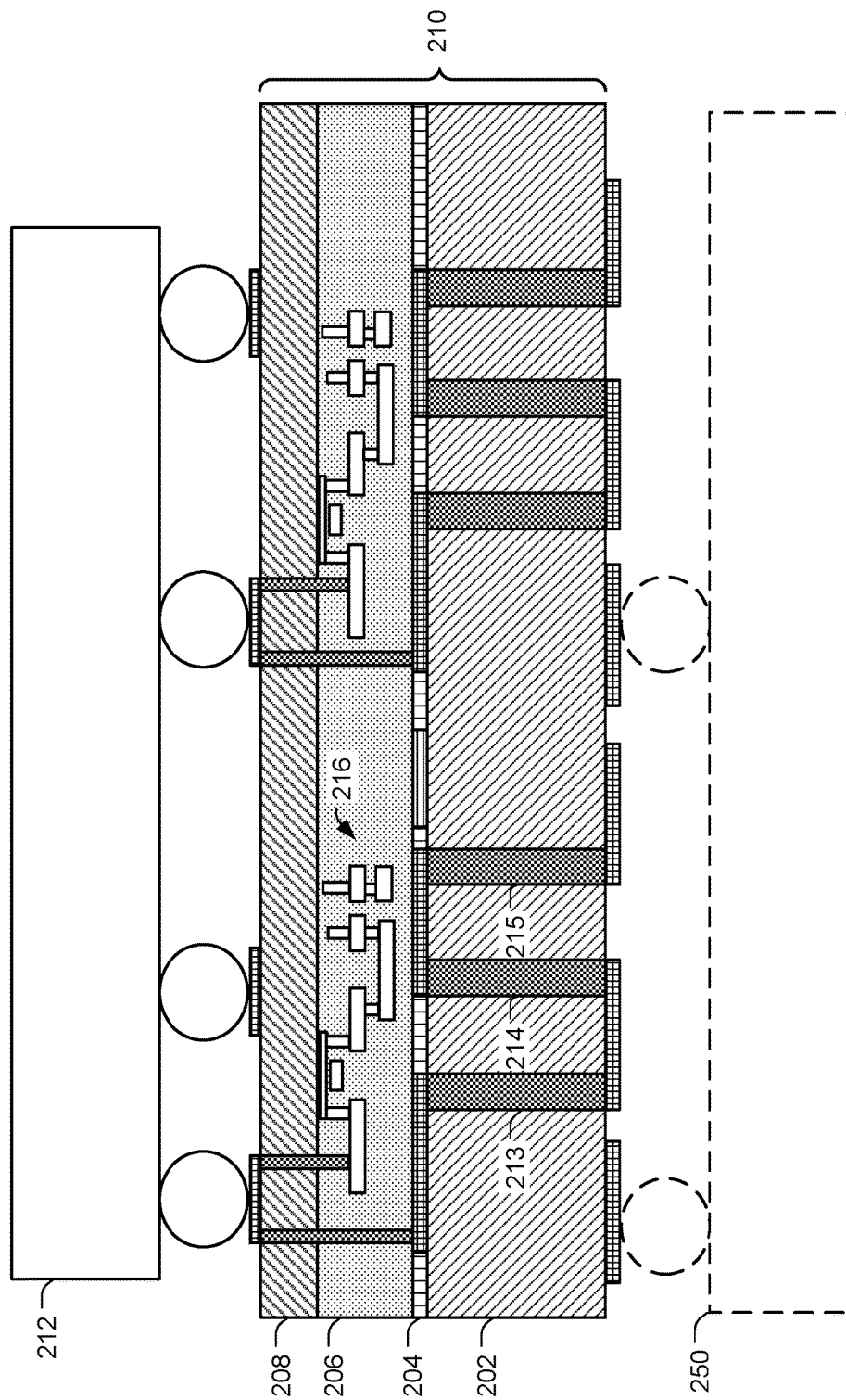

INTERPOSER DEVICE INCLUDING AT LEAST ONE TRANSISTOR AND AT LEAST ONE THROUGH-SUBSTRATE VIA

I. FIELD

The present disclosure is generally related to interposer devices including at least one transistor and at least one through-substrate via.

II. DESCRIPTION OF RELATED ART

Advances in technology have resulted in smaller and more powerful computing devices. For example, a variety of portable personal computing devices, including wireless telephones such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing and networking capabilities.

Some semiconductor devices, such as mobile devices and other devices that transmit or receive radio frequency (RF) signals, include RF circuitry (e.g., transmitters, receivers, low noise amplifiers, power amplifiers, etc.) in addition to complimentary metal-oxide-semiconductor (CMOS) transistors. In some implementations, CMOS transistors used by a power amplifier (or other RF devices) are located adjacent to, or nearby, the power amplifier (or other RF devices) on a semiconductor die. Such an arrangement on the semiconductor die results in a semiconductor die (or a portion thereof) having a large footprint (e.g., surface area). A semiconductor layer may be bonded to a substrate to form an interposer using a chip-level process. The chip-level process may include dicing the substrate to form a portion of an interposer device and bonding an already-diced semiconductor layer to the substrate to form the interposer device. Because the substrate and the semiconductor layer are processed independently, vias may be separately formed in the semiconductor layer and the substrate prior to bonding. Because the vias are already formed, the vias are aligned prior to (or during) a bonding process, and can lead to via mis-alignment.

III. SUMMARY

In a particular aspect, a device includes a substrate including at least one through-substrate via. A metal structure is disposed on a surface of the substrate. The device further includes a semiconductor layer bonded to the substrate. The semiconductor layer includes at least one complimentary metal-oxide-semiconductor (CMOS) transistor and a metal disposed within a second via. The metal is in direct contact with the metal structure.

In another particular aspect, a method includes disposing a metal structure on a surface of a substrate. At least a portion of the metal structure is formed over at least one through-substrate via within the substrate. The method includes bonding a semiconductor layer to the substrate. The semiconductor layer includes at least one complimentary metal-oxide-semiconductor (CMOS) transistor. The method includes forming a cavity within the semiconductor layer. The cavity is formed over at least a portion of the metal structure. The method further includes depositing a metal within the cavity to form a second via. The metal is in direct contact with the metal structure.

In another particular aspect, an apparatus includes means for structurally supporting one or more semiconductor device layers. The means for structurally supporting includes first means for conducting extending through the means for structurally supporting. Second means for conducting is disposed on a first surface of the means for structurally supporting. The apparatus further includes means for switching. The means for switching is included in a semiconductor layer bonded to the means for structurally supporting. The semiconductor layer includes third means for conducting within the semiconductor layer. A metal disposed in the third means for conducting is in direct contact with the second means for conducting.

In another particular aspect, a device includes an interposer device. The interposer device includes at least one complimentary metal-oxide-semiconductor (CMOS) transistor. The interposer device further includes a filter configured to filter a radio frequency signal. The filter includes at least one capacitor and an inductor. The inductor includes a plurality of metal structures disposed on one or more surfaces of a substrate and a plurality of through-substrate vias within the substrate.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

FIG. 1 is a block diagram of a particular illustrative aspect of a device that includes an interposer device including a semiconductor layer having at least one transistor and a substrate having at least one through-substrate via;

FIGS. 2A-G illustrate stages of an illustrative process to form an interposer device by bonding a semiconductor layer to a substrate;

V. DETAILED DESCRIPTION

Figure 1:
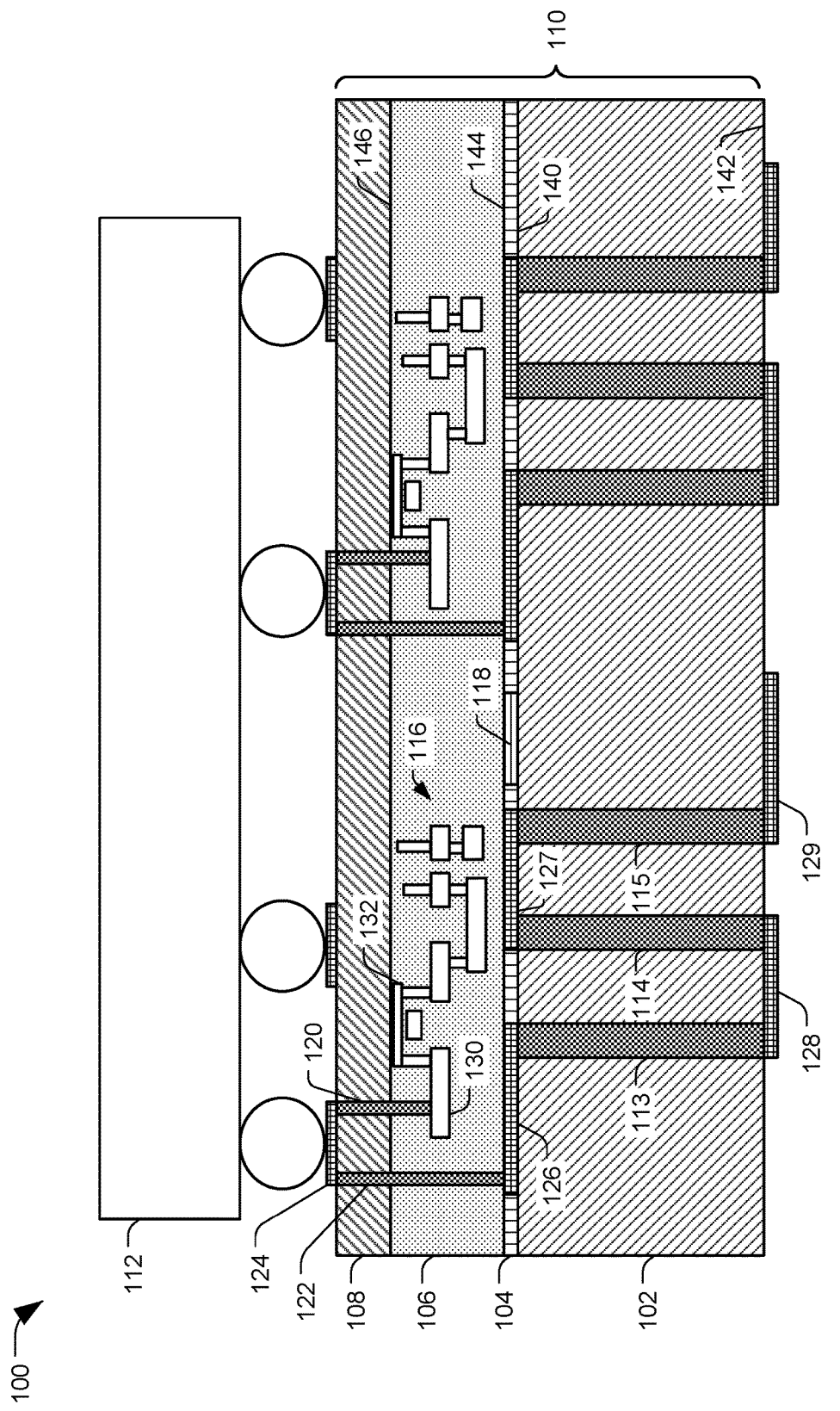

Particular aspects of the present disclosure are described below with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. It may be further understood that the terms "comprise," "comprises," and "comprising" may be used interchangeably with "include," "includes," or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

The present disclosure describes devices that include an interposer device including at least one transistor and including at least one through-substrate via. The interposer device may be coupled between two or more semiconductor dies and may provide interconnections between the semiconductor dies and additional functionality. For example, the interposer device may be disposed vertically between two semiconductor dies, thereby enabling die stacking (e.g., a stacked die configuration). The interposer device includes a substrate that includes at least one through-substrate via. The interposer device also includes a semiconductor layer that includes at least one transistor. The at least one transistor enables switching functionality at the interposer, and the at least one through-substrate via enables a semiconductor device coupled to one side of the interposer device to be electrically coupled to a semiconductor device coupled to the opposite side of the interposer. The substrate may be formed from one or more of a variety of materials, such as glass, silicon, or laminate, as non-limiting examples.

The semiconductor layer may be formed separately from the substrate and may be bonded to the substrate as part of a wafer-level layer transfer process. Prior to bonding the semiconductor layer to the substrate, at least one metal structure (e.g., one or more bonding pads or metal lines) is formed on a first surface of the substrate. A dielectric layer may be formed on the first surface and on the at least one metal structure, and a planarization process may be performed to expose the at least one metal structure. After the planarization process is complete, the semiconductor layer is bonded to the substrate (e.g., to the dielectric layer on the substrate). The semiconductor layer is bonded to the substrate without using a metal "bump" or "ball" disposed between a portion of the semiconductor layer and the metal structure. Accordingly, gaps between the semiconductor layer and the substrate (e.g., the dielectric layer on the substrate) may be reduced or eliminated as compared to semiconductor structures that are formed by bonding two layers using metal bumps or balls.

After the semiconductor layer is bonded to the dielectric, a cavity may be formed in the semiconductor layer above the at least one metal structure, and a metal may be deposited in the cavity to form a via. Because there is no bump (or ball) between the semiconductor layer and the substrate, at least a portion of the metal within the via is in direct and intimate contact with the at least one metal structure (e.g., a bonding pad). Additionally, a metal disposed within a through-substrate via beneath the bonding pad may be in direct and intimate contact with the bonding pad (e.g., from an opposite side of the bonding pad).

In a particular implementation, the semiconductor layer is directly bonded to the dielectric layer on the substrate. To illustrate, the semiconductor layer may be "pressed" against the dielectric layer (e.g., with no intervening layers), which causes covalent bonds to form between atoms of the semiconductor layer and the dielectric layer. The covalent bonds adhere the semiconductor layer to the dielectric layer. In this implementation, the dielectric layer and the semiconductor layer include silicon dioxide, and the covalent bonds are formed between atoms of silicon dioxide. In an alternate implementation, an adhesive layer is formed on the dielectric layer. In this implementation, the semiconductor layer is attached to the adhesive layer.

After the semiconductor layer is bonded to the substrate (e.g., to the dielectric layer), post-processing, such as via formation, may be performed on the semiconductor layer and the substrate. For example, a via may be formed above the at least one metal structure by forming a cavity and depositing a metal in the cavity. Because the semiconductor layer is bonded to the substrate prior to the via formation, the semiconductor and the substrate are aligned prior to the via formation. Thus, a via formed during post-processing is formed through both the semiconductor layer and the substrate. Because the via is formed through both layers after bonding, the via does not have potential misalignment issues associated with a chip-level bonding process. After post-processing is complete, the substrate and the semiconductor layer are diced to form an interposer.

In a particular implementation, a plurality of through-substrate vias within the interposer device form an inductor. For example, a set of bonding pads (e.g., metal structures) may be formed on each side of the substrate and coupled to the plurality of through-substrate vias, and the set of bonding pads and the plurality of through-substrate vias may form an inductor, such as a toroidal inductor. At least one capacitor (e.g., a metal-insulator-metal capacitor) may be formed on a surface of the substrate and may be coupled to the inductor. The at least one capacitor and the inductor may form an inductive-capacitive (LC) filter within the interposer. One or more vias may couple the LC filter (e.g., the inductor and/or the at least one capacitor) and the at least one transistor within the semiconductor layer to one or more bonding pads on a surface of the dielectric layer (or a surface of an insulating layer disposed on the dielectric layer), and a semiconductor die may be electrically coupled to the one or more bonding pads. Although metal bumps (or balls) are not used to form connections between layers of the interposer device, metal bumps (or balls) may be used to form connections between the interposer device and one or more semiconductor dies. For example, one or more metal bumps (or balls) may be formed on one or more bonding pads, and a semiconductor die may be electrically coupled to the one or more bumps (or balls). The semiconductor die may include radio frequency (RF) circuitry, such as a power amplifier.

Because the interposer device is formed without using metal bumps (or balls) to couple the semiconductor layer to the dielectric layer on the substrate, gaps between the semiconductor layer and the dielectric layer may be reduced or eliminated as compared to interposers with metal bumps (or balls) between a substrate and another layer. Reducing (or eliminating) gaps between the semiconductor layer and the dielectric layer may reduce the size of the interposer device and may improve connections between the layers of the interposer. Because the semiconductor layer and the substrate are bonded using a wafer-level bonding process, vias may be formed through both layers at the same time after bonding the two layers together. Forming vias through both layers after bonding the two layers together reduces (or eliminates) via mis-alignment that is associated with chip-level processes that form a via in each layer individually and attempt to align the vias when bonding the layers together. Additionally, because switching functionality is provided by the at least one transistor within a layer (e.g., the semiconductor layer) of the interposer, one or more transistors that would otherwise be included in the semiconductor die (e.g., the power amplifier) are not present. In some implementations, the interposer device includes an inductor that includes the through-substrate vias. In these implementations, at least some filtering circuitry (e.g., an inductor) that would otherwise be included in the semiconductor die is not present. Reducing the number of transistors, inductors, or both present in the semiconductor die reduces a footprint (e.g., a surface area) of the semiconductor die. Thus, the interposer device of the present invention enables reduction in the size of a semiconductor die that includes RF circuitry by offloading at least some switching functionality and filtering to the interposer. Additionally, the interposer device enables three-dimensional (3-D) integration of multiple devices (e.g., by forming a stacked device that includes the interposer between multiple devices or semiconductor dies).

Referring to FIG. 1, a particular illustrative aspect of a device that includes an interposer device including a semiconductor layer having at least one transistor and a substrate having at least one through-substrate via is shown and generally designated 100. The device 100 includes a substrate 102, a dielectric layer 104, a semiconductor layer 106, an optional insulating layer 108, and a semiconductor device 112 (e.g., a semiconductor die). The substrate 102, the dielectric layer 104, the semiconductor layer 106, and the insulating layer 108 may be referred to as an interposer device 110. The interposer device 110 may facilitate connection of two or more devices. For example, the interposer device 110 may be coupled to a first device and a second device and may enable connection between the first device and the second device. As one example, the semiconductor device 112 may be electrically coupled to the interposer device 110 (e.g., via at least one bonding pad), as illustrated in FIG. 1 and further described herein. The two or more devices may include semiconductor dies, circuit boards, integrated circuits, other electrical devices, or a combination thereof. The interposer device 110 may enable three-dimensional (3D) integration of the two or more devices. For example, the interposer device 110 may be disposed vertically between the two or more devices. In this manner, multiple devices may be stacked, which reduces a surface area occupied by the multiple devices as compared to disposing the multiple devices adjacent to one another horizontally.

The interposer device 110 includes the substrate 102. The substrate 102 has a first surface 140 and a second surface 142 that is on an opposite side of the substrate 102 than the first surface 140. The substrate 102 includes at least one through-substrate via that extends from the first surface 140 of the substrate to the second surface 142 of the substrate. As illustrated in FIG. 1, the substrate 102 may include a first through-substrate via 113, a second through-substrate via 114, a third through-substrate via 115, and other through-substrate vias. Although illustrated as including six through-substrate vias in FIG. 1, in other implementations, the substrate 102 may include more than six or fewer than six through-substrate vias. The substrate 102 may be formed of one or more materials. In a particular implementation, the substrate 102 includes a glass substrate, and the through-substrate vias 113-115 include at least one through-glass via (TGV). In another particular implementation, the substrate 102 includes a silicon substrate, and the through-substrate vias 113-115 include at least one through-silicon via (TSV). In another particular implementation, the substrate 102 includes a laminate substrate, and the through-substrate vias 113-115 include at least one through-laminate via. In other implementations, the substrate 102 may be formed from other materials.

At least one metal structure may be disposed on the first surface 140 of the substrate 102. The at least one metal structure may include a bonding pad, a metal wire, or another metal structure. For example, a first metal structure 126 (e.g., a first bonding pad) and a second metal structure 127 (e.g., a second bonding pad) may be disposed on the first surface 140 of the substrate 102. Although four metal structures are disposed on the first surface 140 of the substrate 102 in FIG. 1, in other implementations, more than four or fewer than four metal structures may be disposed on the first surface 140 of the substrate 102. Additionally, one or more metal structures (e.g., bonding pads, metal lines, etc.) may be disposed on the second surface 142 of the substrate 102. For example, a third metal structure 128 (e.g., a third bonding pad) and a fourth metal structure 129 (e.g., a fourth bonding pad).

In the orientation illustrated in FIG. 1, at least a portion of each metal structure disposed on the first surface 140 may be disposed over at least one through-substrate via. For example, at least a portion of the first metal structure 126 may be disposed over the first through-substrate via 113, and at least a portion of the second metal structure 127 may be disposed over the second through-substrate via 114 and the third through-substrate via 115. In the orientation illustrated in FIG. 1, at least a portion of each metal structure disposed on the second surface 142 may be disposed beneath (e.g., under) at least one through-substrate via. For example, at least a portion of the third metal structure 128 may be disposed beneath the first through-substrate via 113 and the second through-substrate via 114, and at least a portion of the fourth metal structure 129 may be disposed beneath the third through-substrate via 115. The relative positioning of the metal structures 126-129 and the through-substrate vias 113-115 depends on the orientation of the substrate 102.

Multiple metal structures may be electrically coupled together by a through-substrate via. For example, the first metal structure 126 may be coupled to the third metal structure 128 by the first through-substrate via 113, the third metal structure 128 may be coupled to the second metal structure 127 by the second through-substrate via 114, and the second metal structure 127 may be coupled to the fourth metal structure 129 by the third through-substrate via 115. Metals disposed within each of the through-substrate vias may be in direct and intimate contact. For example, a metal disposed within the first through-substrate via 113 may be in direct contact with the first metal structure 126 and the third metal structure 128, a metal disposed within the second through-substrate via 114 may be in direct contact with the second metal structure 127 and the third metal structure 128, and a metal disposed within the third through-substrate via 115 may be in direct contact with the second metal structure 127 and the fourth metal structure 129. As used herein, two components are in "direct and intimate contact" if the two components are in contact with each other and there are no intervening layers or other components (other than air). As used herein, two components are "coupled" together if there is a connection between the two components, although there may be intervening layers or components.

The substrate 102 may include the dielectric layer 104. The dielectric layer 104 may be disposed on the first surface 140 of the substrate 102. In a particular implementation, the dielectric layer 104 includes a first oxide. As an illustrative, non-limiting example, the dielectric layer 104 may include silicon-dioxide. In other implementations, the dielectric layer 104 may include other materials. Portions of the dielectric layer 104 may be located between the metal structures disposed on the first surface 140. For example, as illustrated in FIG. 1, portions of the dielectric layer may be located between the first metal structure 126 and the second metal structure 127. The dielectric layer 104 may be configured to electrically isolate metal structures disposed on the first surface 140, such as the first metal structure 126 and the second metal structure 127. To form the dielectric layer 104, a dielectric material may be deposited on the first surface 140 of the substrate 102 and on the metal structures, and a planarization process may be performed to expose surfaces of the metal structures, as further described with reference to FIGS. 2A-G. Due to the planarization process, a thickness of the dielectric layer 104 may be the same as (or substantially equal to) thicknesses of the metal structures 126, 127. As used herein, substantially equal refers to measurements that are equal or are within a tolerance, such as a design tolerance, a fabrication or manufacturing tolerance, or a measurement tolerance.

The interposer device 110 includes the semiconductor layer 106 bonded to the substrate 102 (e.g., to the dielectric layer 104 on the substrate 102). The semiconductor layer 106 includes at least one complimentary metal-oxide-semiconductor (CMOS) transistor. For example, the semiconductor layer 106 may include an illustrative transistor 116. As illustrated in FIG. 1, the semiconductor layer 106 may include a plurality of transistors. In other implementations, the semiconductor layer 106 may include a single transistor or more than two transistors. Although described herein as CMOS transistors, in other implementations, the semiconductor layer 106 may include at least one switch instead of the at least one CMOS transistor. For example, the semiconductor layer may include at least one field effect transistor, at least one bipolar junction transistor (BJT), or another component configured to selectively output one of at least two outputs based on an input (e.g., to perform switching functionality between at least two outputs based on an input). In this manner, the semiconductor layer 106 may be configured to enable switching functionality (e.g., due to the at least one CMOS transistor or other switch).

The semiconductor layer 106 is bonded to the substrate 102 (e.g., to the dielectric layer 104 on the substrate 102). In a particular implementation, at least a portion of a first surface 144 of the semiconductor layer 106 is in direct contact with one or more dielectric portions (e.g., portions of the dielectric layer 104). In this implementation, the semiconductor layer 106 includes a second oxide. As an illustrative, non-limiting example, the semiconductor layer 106 may include silicon dioxide. When the semiconductor layer 106 is pressed against the dielectric layer 104 during a bonding process, as further described with reference to FIGS. 2A-G, covalent bonds may form between atoms of the dielectric layer (e.g., the first oxide) and atoms of the semiconductor layer (e.g., the second oxide). The covalent bonds may adhere the semiconductor layer 106 to the dielectric layer 104, thereby bonding the semiconductor layer 106 to the substrate 102. In another particular implementation, an adhesive layer (not shown) may be disposed between the substrate 102 (e.g., the dielectric layer 104) and the semiconductor layer 106. The adhesive layer may include glue or another adhesive and may be configured to adhere the semiconductor layer 106 to the dielectric layer 104. In other implementations, the semiconductor layer 106 may be bonded to the substrate 102 using other techniques, such as metal-to-metal bonding or other bonding techniques. The semiconductor layer 106 may be bonded to the substrate 102 in an orientation in which a source contact 130 of the transistor 116 (e.g., a first CMOS transistor) is located between a source/drain region 132 and the substrate 102. Such an orientation of the semiconductor layer 106 may be referred to as upside-down, as compared to conventional orientations of layers that include transistors.

In some implementations, the interposer device 110 includes the insulating layer 108. The insulating layer may be disposed on a second surface 146 of the semiconductor layer 106. The insulating layer 108 may include a buried oxide (BOx) layer. The insulating layer 108 may be configured to electrically insulate components of the semiconductor layer 106, such as the transistors or other metal structures, from other components. The insulating layer 108 is optional and may not be present in at least some implementations.

The interposer device 110 may include one or more vias that extend through at least a portion of the semiconductor layer 106, at least a portion of the insulating layer 108 (if the insulating layer 108 is present), or both. For example, the interposer device may include a second via 122 and a first via 120. The second via 122 may extend through an entirety of the insulating layer 108 and an entirety of the semiconductor layer 106, and the first via 120 may extend through an entirety of the insulating layer 108 and a portion of the semiconductor layer 106, as illustrated in FIG. 1. At least one via may be located above (or over) a metal structure disposed on the first surface 140 of the substrate 102, in the orientation illustrated in FIG. 1. For example, the second via 122 may be located above the first metal structure 126. In some implementations, at least one via may be located above (or over) a transistor within the semiconductor layer 106. For example, the first via 120 may be located above the transistor 116, in the orientation illustrated in FIG. 1.

Because the semiconductor layer 106 is directly bonded to the dielectric layer 104 on the substrate 102, metal bumps (or balls) are not used to bond components of the semiconductor layer 106 to components of the substrate 102, such as the metal structures 126 and 127. Because metal bumps (e.g., bump attachment) are not used for bonding the layers, gaps between the semiconductor layer 106 and the dielectric layer 104 (e.g., the substrate 102) may be reduced or eliminated, as compared to semiconductor devices that are formed by bonding layers using metal bumps (or balls). Additionally, a metal disposed in a via within the semiconductor layer 106 may be in direct and intimate contact with a metal structure disposed on the first surface 140 of the substrate 102. For example, a metal disposed within the second via 122 may be in direct contact with the first metal structure 126 (e.g., the first bonding pad). Reducing (or eliminating) gaps between the semiconductor layer 106 and the dielectric layer 104, as well as having metal in vias in direct contact with metal structures (e.g., bonding pads), may reduce a dimension (e.g., height or thickness) of the interposer device 110 and may improve electrical connections between components of the semiconductor layer 106 and the substrate 102.

The interposer device 110 may include at least one bonding pad disposed on the semiconductor layer 106 (or the insulating layer 108 if the insulating layer 108 is present). For example, the at least one bonding pad may include a bonding pad 124 disposed on the insulating layer 108. The insulating layer 108 may be disposed between the semiconductor layer 106 and the at least one bonding pad (e.g., the bonding pad 124), as illustrated in FIG. 1. In other implementations, the insulating layer 108 is not present, and the bonding pad 124 is disposed on the semiconductor layer 106. The semiconductor layer 106 may be located between the at least one bonding pad and the substrate 102, and the at least one bonding pad may be configured to be electrically coupled to a device, such as the semiconductor device 112. To illustrate, one or more metal bumps (or balls) may be disposed on the at least one bonding pad, and the semiconductor device 112 may be coupled to the interposer device 110 using the one or more metal bumps (or balls). Metal bumps (or balls) may be used to couple the interposer device 110 to the semiconductor device 112 because the semiconductor device 112 and the interposer device 110 are not directly bonded (e.g., using surface-to-surface bonding or adhesive, as described above with reference to the semiconductor layer 106 and the dielectric layer 104).

The at least one bonding pad disposed on the insulating layer 108 (or the semiconductor layer 106 if the insulating layer 108 is not present) may be coupled to components of the substrate 102 and to components of the semiconductor layer 106 by one or more vias. For example, the bonding pad 124 may be coupled to the first metal structure 126 by the second via 122, and the bonding pad 124 may be coupled to the transistor 116 by the first via 120. As illustrated in FIG. 1, the second via 122 may extend from the bonding pad 124 through the insulating layer 108 and the semiconductor layer 106 to the first metal structure 126. In some implementations, the at least one bonding pad may be electrically connected to metal structures on the second surface 142 of the substrate 102 (and to a second semiconductor device if the second semiconductor device is coupled to the second surface 142 of the substrate 102). To illustrate, a metal disposed within the second via 122 may be in direct contact with a first surface of the first metal structure 126, a second metal disposed within the first through-substrate via 113 may be in direct contact with a second surface of the first metal structure 126, and the bonding pad 124 may be coupled to the third metal structure 128 by the second via 122, the first metal structure 126, and the first through-substrate via 113. In a particular implementation, a metal structure (e.g., the first metal structure 126) may be coupled to a first bonding pad (e.g., the bonding pad 128) of the at least one bonding pad by a first via (e.g., the first through-substrate via 113), the first bonding pad may be coupled to the metal structure by a second via (e.g., the second via 122), and the first bonding pad may be coupled to at least one CMOS transistor by a third via (e.g., the first via 120).

In a particular implementation, the interposer device 110 may include an inductor. For example, an inductor may include one or more metal structures disposed on the substrate 102 and a plurality of through-substrate vias within the substrate 102. In a particular implementation, an inductor includes the metal structures 126-129 and the through-substrate vias 113-115. The inductor may include a toroidal inductor or another type of inductor. The interposer device 110 may also include one or more capacitors disposed on a surface of the substrate 102 and coupled to the inductor. For example, the interposer device 110 may include a capacitor 118 disposed on the first surface 140 of the substrate 102. The one or more capacitors may include metal-insulator-metal (MIM) capacitors or other types of capacitors.

A filter (e.g., an inductive-capacitive (LC) filter) may include the inductor (e.g., the metal structures 126-129 and the through-substrate vias 113-115) and the capacitor 118. The filter may be configured to filter a signal from the semiconductor device 112. In a particular implementation, the semiconductor device 112 includes radio-frequency (RF) circuitry or one or more RF devices, such as a power amplifier. The filter within the interposer device 110 may be configured to filter an RF signal prior to (or subsequent to) amplification by the power amplifier in the semiconductor device 112. In other implementations, the semiconductor device 112 may include a low noise amplifier, and the filter within the interposer device 110 may be configured to filter an RF signal prior to (or subsequent to) amplification by the low noise amplifier in the semiconductor device 112. In a particular implementation, the device 100 (e.g., the semiconductor device 112 and the interposer device 110) may be included in a transmitter, in a receiver, or in a transceiver. The transmitter, the receiver, or the transceiver may be included in a mobile device, such as a mobile phone, a portable computing device, a laptop computer, a tablet computer, a computerized watch, a global positioning system, an entertainment system, a vehicle (or a component of a vehicle), or another device. Additionally or alternatively, the transmitter, the receiver, or the transceiver may be included in a base station of a mobile communication system.

In a particular implementation, the interposer device 110 includes at least one CMOS transistor and filter configured to filter a radio frequency signal. The at least one CMOS transistor may include the transistor 116. The filter includes at least one capacitor and an inductor. To illustrate, the at least one capacitor may include the capacitor 118 and the inductor may include the inductor formed by a plurality of metal structures disposed on one or more surfaces of the substrate 102 (e.g., the metal structures 126-129) and a plurality of through-substrate vias within the substrate 102 (e.g., the through-substrate vias 113-115). The interposer device 110 may further include a bonding pad (e.g., the bonding pad 124) disposed on a surface of the interposer device 110. The bonding pad 124 may be coupled to the filter by a via within the interposer device 110 (e.g., the second via 122), and a metal disposed within the via may be in directed contact with at least one of the plurality of metal structures (e.g., the first metal structure 126).

During operation, the semiconductor device 112 may receive an RF signal as part of a transmitter. For example, the RF signal may be received from a baseband processor or another component of a transmit chain, which may be located on a different semiconductor die that the semiconductor device 112. The RF signal may be provided to the interposer device 110 via the bonding pad 124, and the RF signal may be provided to the filter (e.g., the capacitor 118 and the inductor formed from the metal structures 126-129 and the through-substrate vias 113-115) by the second via 122. The filter within the interposer device 110 may filter the RF signal, and the filtered RF signal may be provided back to the semiconductor device 112 by another via (not illustrated). Additionally or alternatively, one or more inputs may be provided to the transistor 116 using the first via 120. The transistor 116 may selectively provide one of multiple output signals based on the input signal, and the selected output signal may be provided back to the semiconductor device 112 by another via (not illustrated). Thus, filtering (e.g., using the filter within the interposer device 110) and switching functionality (e.g., using the at least one CMOS capacitor within the semiconductor layer 106) may be offloaded from the semiconductor device 112 to the interposer device 110.

Because the interposer device 110 is formed without using metal bumps (or balls) to couple the semiconductor layer 106 to the dielectric layer 104 on the substrate 102, gaps between the semiconductor layer 106 and the dielectric layer 104 may be reduced or eliminated as compared to interposers with metal bumps (or balls) between a substrate and another layer. Reducing (or eliminating) gaps between the semiconductor layer 106 and the dielectric layer 104 may reduce the size (e.g., the thickness) of the interposer device 110 and may improve connections between the layers of the interposer device 110. Because the semiconductor layer 106 and the substrate 102 (e.g., the dielectric layer 104) are bonded using a wafer-level bonding process, vias may be formed through both layers at the same time after bonding the two layers together. Forming vias through both layers after bonding the two layers together reduces (or eliminates) via mis-alignment that is associated with chip-level processes that form a via in each layer individually and attempt to align the vias when bonding the layers together. Additionally, because switching functionality is provided by the at least one CMOS transistor within a layer (e.g., the semiconductor layer 106) of the interposer device 110, one or more transistors that would otherwise be included in the semiconductor device 112 are not present. In some implementations, the interposer device 110 includes an inductor that includes the through-substrate vias 113-115. In these implementations, at least some filtering circuitry (e.g., an inductor and capacitor(s)) that would otherwise be included in the semiconductor device 112 is not present in the semiconductor device 112. Reducing the number of transistors, inductors, or both in the semiconductor device 112 reduces a footprint (e.g., a surface area) of the semiconductor device 112. Thus, the interposer device 110 enables reduction in the size of a semiconductor device 112 by offloading at least some switching functionality and filtering to the interposer device 110. Additionally, the interposer device 110 enables 3-D integration of multiple devices (e.g., by forming a stacked device that includes the interposer device 110 disposed between multiple devices or semiconductor dies, or between a semiconductor device and a package).

FIGS. 2A-G illustrate stages of an illustrative process to form an interposer device by bonding a semiconductor layer to a substrate. The interposer device includes a semiconductor layer that includes at least one CMOS transistor and a substrate that includes at least one through-substrate via. The interposer device may be the interposer device 110 of FIG. 1. In a particular implementation, the steps of the process may be initiated and/or performed by one or more devices described with reference to FIG. 6.

Figure 2A:
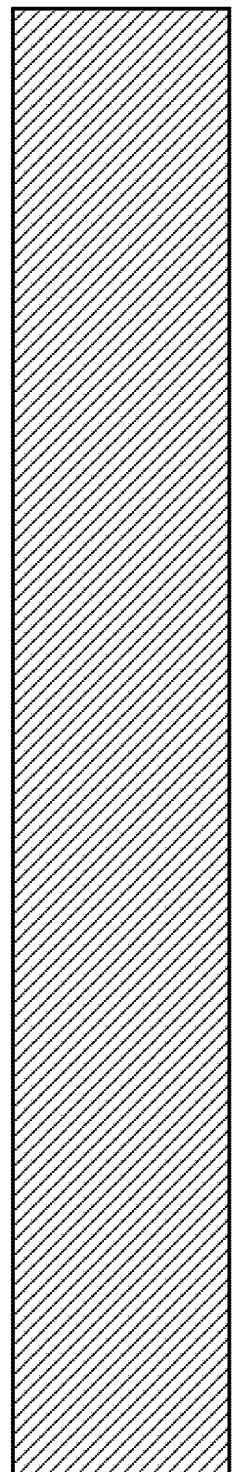

Referring to FIG. 2A, a first illustrative diagram of at least one stage of an illustrative process to form an interposer device by bonding a semiconductor layer to a substrate is shown. As illustrated in FIG. 2A, the process begins with a substrate 202. The substrate 202 may include or correspond to the substrate 102 of FIG. 1. The substrate 202 may include a glass substrate, a silicon substrate, a laminate substrate, or another type of substrate.

Figure 2B:
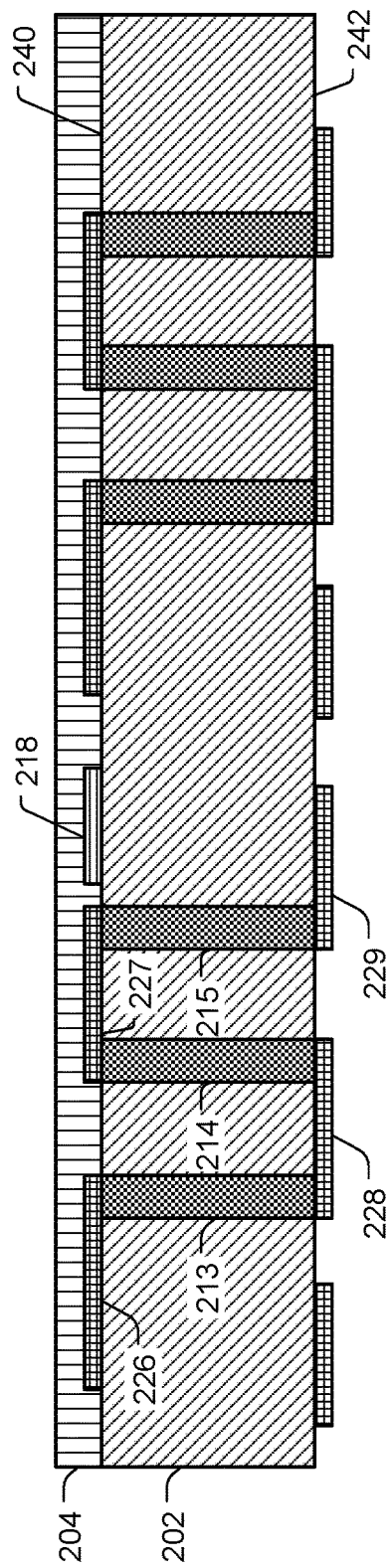

Referring to FIG. 2B, a second illustrative diagram of at least one stage of the process to form the interposer device is shown. As illustrated in FIG. 2B, through-substrate vias 213-215 may be formed within the substrate 202. The through-substrate vias 213-215 may include or correspond to the through-substrate vias 113-115 of FIG. 1. The through-substrate vias 213-215 may be formed by forming cavities within the substrate 202 and by depositing metal within the cavities. The cavities may be formed by drilling, by etching, by using a laser, or by another technique to form cavities that extend through the substrate 202. After the through-substrate vias 213-215 are formed, one or more metal structures may be formed on or attached to a first surface 240 of the substrate 202. For example, metal structures 226 and 227 may be formed (or attached) to the first surface 240 of the substrate 202. The metal structures 226 and 227 may include or correspond to the metal structures 126 and 127 of FIG. 1. As a particular, non-limiting example, the metal structures 226 and 227 may be bonding pads.

At least a portion of the metal structures 226 and 227 may be formed (or attached) to the first surface 240 over (e.g., above) at least one of the through-substrate vias 213-215. For example, at least a portion of the first metal structure 226 may be formed (or attached) over the first through-substrate via 213, at least a portion of the second metal structure 227 may be formed (or attached) over the second through-substrate via 214, and at least a portion of the second metal structure 227 may be formed (or attached) over the third through-substrate via 215. After the metal structures 226 and 227 are formed (or attached), the metal structures 226 and 227 may be in direct and intimate contact with a metal deposited in at least one through-substrate via. For example, a metal disposed within the first through-substrate via 213 may be in direct contact with the first metal structure 226.

Additionally, metal structures may be formed (or attached) to a second surface 242 of the substrate 202 (e.g., a surface on the opposite side of the substrate 202 from the first surface 240). For example, at least a portion of the third metal structure 228 may be formed (or attached) beneath (e.g., under) the first through-substrate via 213, at least a portion of the third metal structure 228 may be formed (or attached) beneath the second through-substrate via 214, and at least a portion of the fourth metal structure 229 may be formed (or attached) beneath the third through-substrate via 215. Additionally, one or more capacitors, such as illustrative capacitor 218, may be formed (or attached) to the first surface 240 of the substrate 202. The capacitor 218 may include or correspond to the capacitor 118 of FIG. 1.

After the metal structures are formed, a dielectric material may be deposited over the metal structures and the first surface 240 of the substrate to form a dielectric layer 204. The dielectric layer 204 may include of correspond to the dielectric layer 104 of FIG. 1. In a particular implementation, the dielectric material includes a first oxide. The first oxide may be silicon dioxide.

Figure 2C:
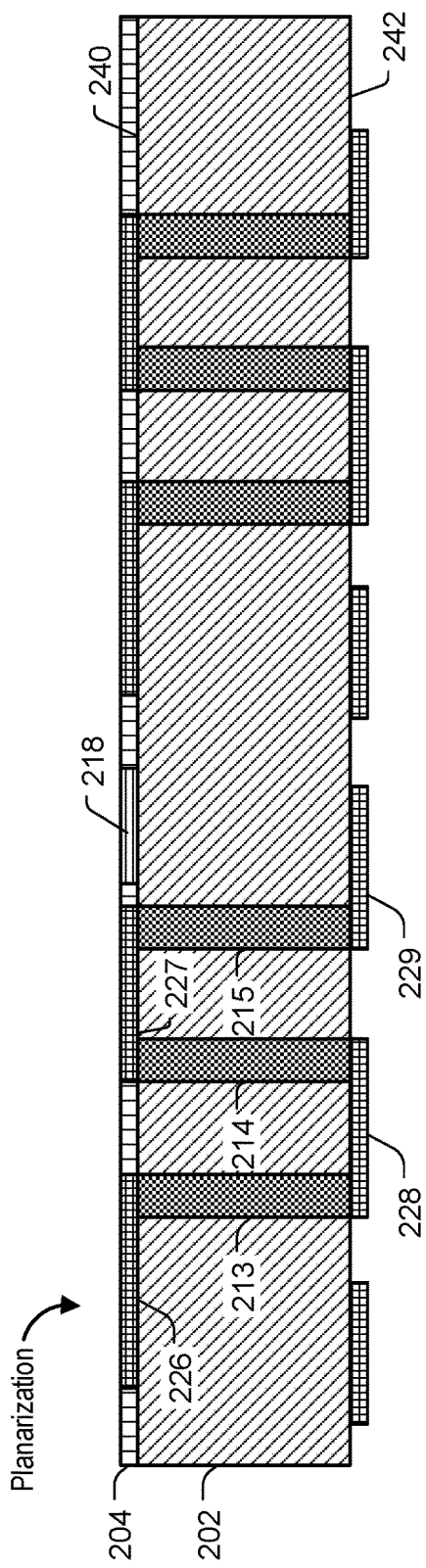

Referring to FIG. 2C, a third illustrative diagram of at least one stage of the process to form the interposer device is shown. As illustrated in FIG. 2C, a planarization process may be performed on the dielectric layer 204 to expose surfaces of the metal structures 226 and 227. The planarization process may remove a portion of the dielectric layer 204 down to the surfaces of the metal structures 226 and 227. For example, after the planarization process is performed, a thickness of the dielectric layer 204 (or the portions thereof) is substantially equal to the thickness of the metal structures 226 and 227. Additionally, the planarization process may polish a surface of the dielectric layer 204. For example, after the planarization process is complete, exposed surfaces of the dielectric layer 204 may be smooth.

Figure 2D:
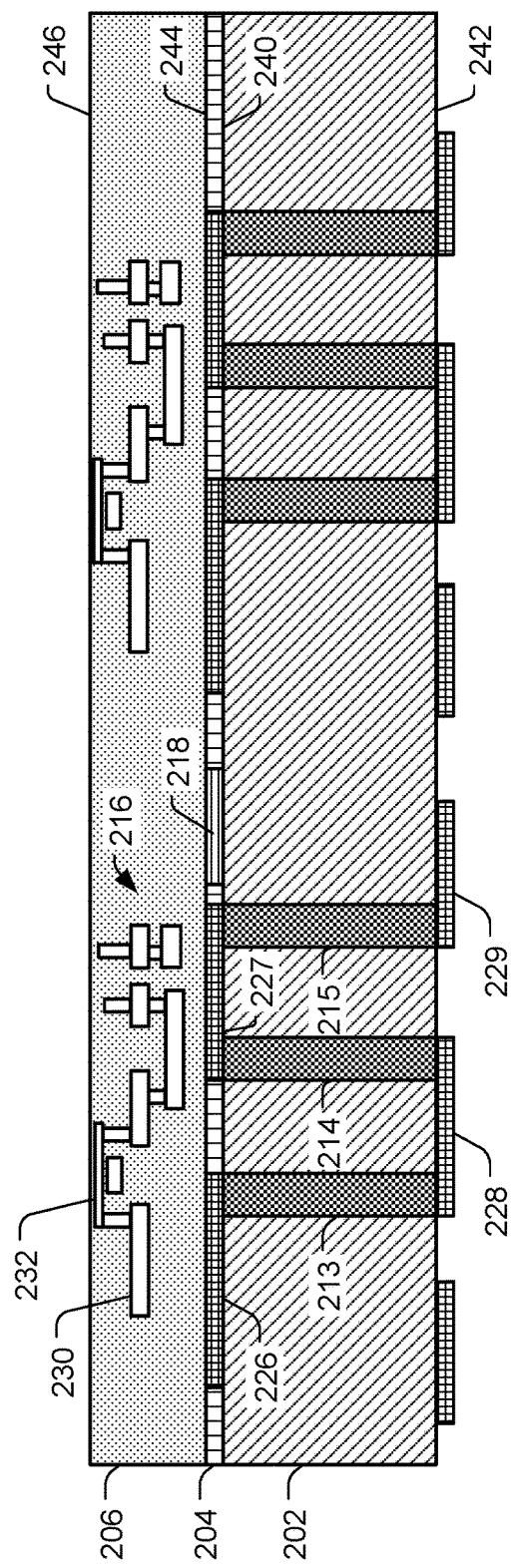

Referring to FIG. 2D, a fourth illustrative diagram of at least one stage of the process to form the interposer device is shown. As illustrated in FIG. 2D, a semiconductor layer 206 may be bonded to the dielectric layer 204 of the substrate 202. Bonding the semiconductor layer 206 to the dielectric layer 204 of the substrate 202 may be referred to as bonding the semiconductor layer 206 to the substrate 202. As illustrated in FIG. 2, a first surface 244 of the semiconductor layer 206 may be bonded to the dielectric layer 204. The semiconductor layer 206 may include at least one CMOS transistor, such as illustrative transistor 216. The semiconductor layer 206 may include or correspond to the semiconductor layer 106 of FIG. 1, and the transistor 216 may include or correspond to the transistor 116 of FIG. 1. The semiconductor layer 206 may be pre-formed and pre-packaged, or the semiconductor layer 206 (and the at least one transistor included within the semiconductor layer 206) may be formed separately from the substrate 202. The semiconductor layer 206 may be bonded to the substrate 202 in an orientation in which a source contact 230 is located between a source/drain region 232 and the substrate 202.

The semiconductor layer 206 may be bonded to the substrate 202 using a wafer-level bonding process. Wafer-level processes refer to semiconductor fabrication or packaging processes that are performed on integrated circuit layers while at least one layer (e.g., the substrate 202) is still part of a wafer. Chip-level processes refer semiconductor fabrication or packaging processes that are performed on integrated circuit layers after the wafer has been diced (e.g., sliced) into individual integrated circuit dies.

In a particular implementation, the semiconductor layer 206 may be bonded to the substrate 202 by directly pressing the semiconductor layer 206 against the dielectric layer 204. In this implementation, the semiconductor layer 206 includes a second oxide, which may be silicon dioxide or another oxide. Pressing the semiconductor layer 206 against the dielectric layer 204 may cause covalent bonds to form between atoms within the oxide of semiconductor layer 206 and atoms within the oxide of the dielectric layer 204. The covalent bonds may cause the semiconductor layer 206 to adhere to the dielectric layer 204. In some implementations, the surfaces of the layers (e.g., the dielectric layer 204 and the semiconductor layer 206) may be activated prior to the bonding. For example, the surfaces may be activated with a plasma activation tool or other activation tool.

In another particular implementation, prior to bonding the semiconductor layer 206 to the substrate 202, an adhesive material may be deposited on the dielectric layer 204 to form an adhesive layer (not shown). In this implementation, the semiconductor layer 206 may be attached to the adhesive layer to bond the semiconductor layer 206 to the substrate 202. In other implementations, other bonding processes, such as a metal-on-metal bonding process, may be used.

Because the semiconductor layer 206 is bonded directly to the dielectric layer 204, metal bumps (or balls) are not used to bond components of the substrate 202 to components of the semiconductor layer 206. Because the metal bumps (or balls) are not used, gaps between the semiconductor layer and the dielectric layer 204 (e.g., the substrate 202) may be reduced or eliminated, as compared to bonding processes that use metal bumps (or balls) for connections between the two layers. Reducing (or eliminating) gaps between the two layers reduces a dimension (e.g., a thickness) of an interposer device and improves connections between components within the two layers.

Figure 2E:
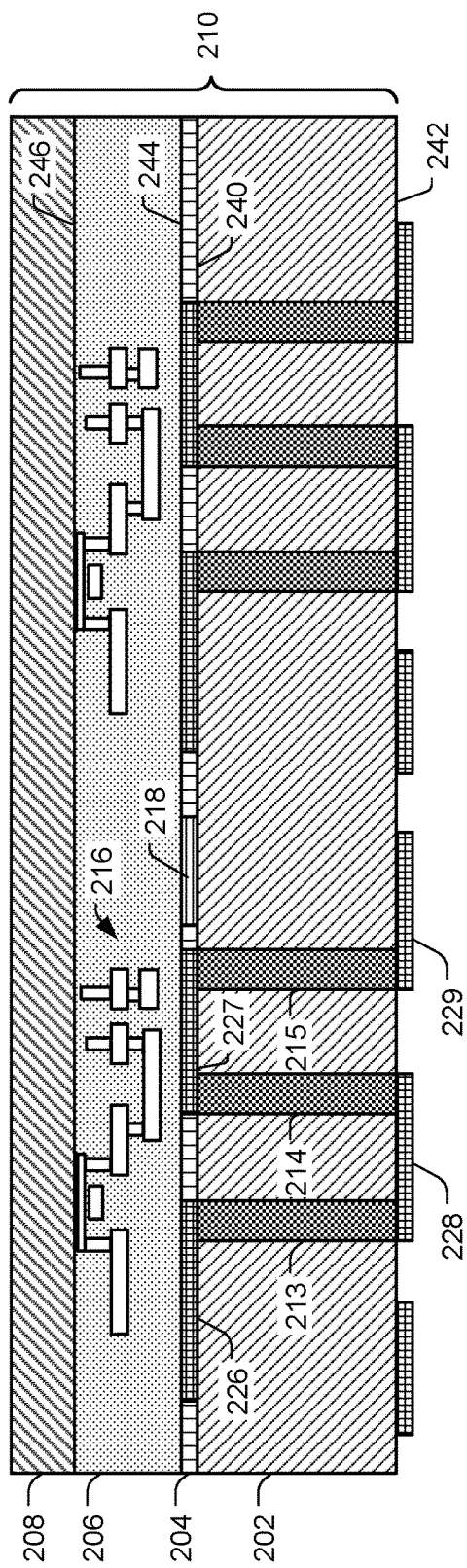

Referring to FIG. 2E, a fifth illustrative diagram of at least one stage of the process to form the interposer device is shown. As illustrated in FIG. 2E, an insulating material may be deposited on the semiconductor layer 206 to form an insulating layer 208. The insulating material may be deposited on a second surface 246 of the semiconductor layer 206 (e.g., a surface on an opposite side of the semiconductor layer 206 from the first surface 244 that is in contact with the dielectric layer 204. The insulating layer 208 may include or correspond to the insulating layer 108 of FIG. 1. In a particular implementation, the insulating layer 208 may be a buried oxide (BOx) layer. The insulating layer 208 is optional and may not be included in some implementations.

Figure 2F:
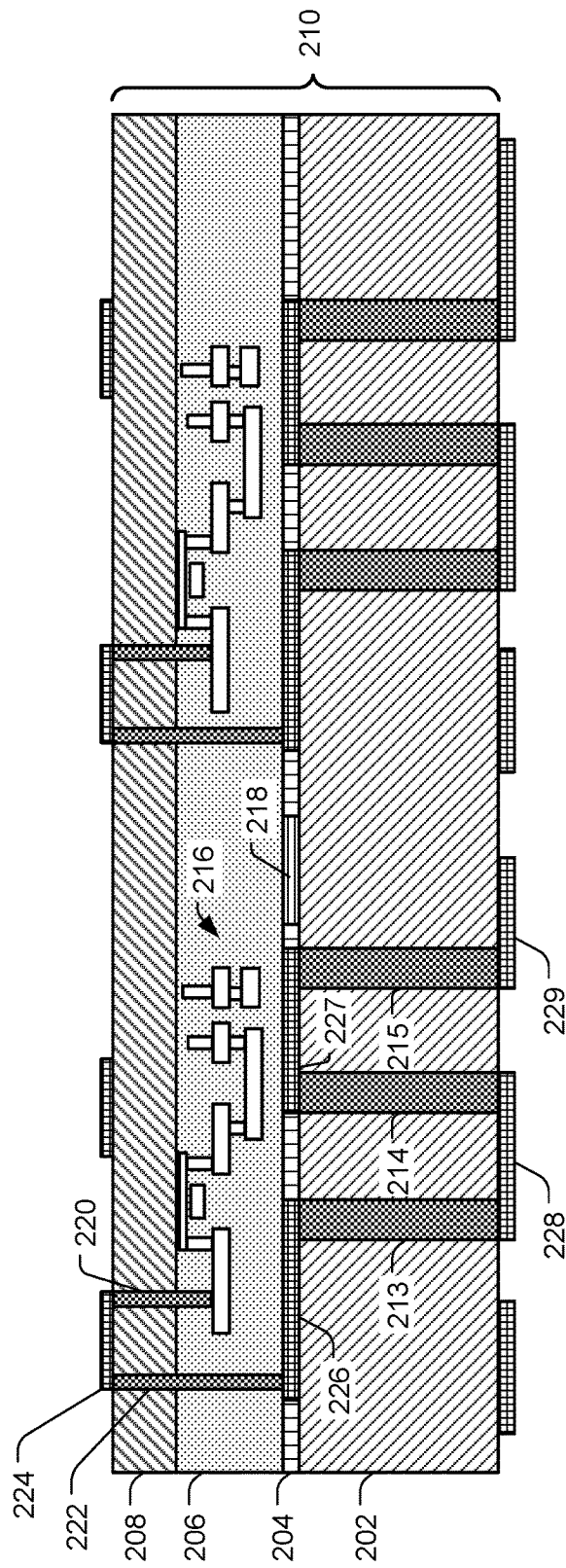

Referring to FIG. 2F, a sixth illustrative diagram of at least one stage of the process to form the interposer device is shown. At this stage, an interposer device 210 may be formed. The interposer device 210 may include or correspond to the interposer device 110 of FIG. 1. The interposer device 210 may include the substrate 202, the dielectric layer 204, the semiconductor layer 206, the optional insulating layer 208, the transistor 216, the metal structures 226-229, and the through-substrate vias 213-215.

During the stage of the process illustrated in FIG. 2F, one or more vias may be formed in the interposer device 210. The vias may extend through the insulating layer 208 (or a portion thereof), through the semiconductor layer 206 (or a portion thereof), or through both. As illustrative examples, a second via 222 and a first via 220 may be formed. The second via 222 and the first via 220 may include or correspond to the second via 122 or the first via 120 of FIG. 1. The vias may be formed during post-processing of the interposer device 210. As illustrated in FIG. 2F, the second via 222 may extend through the insulating layer 208 and through the semiconductor layer 206, and the first via 220 may extend through the insulating layer 208 and through a portion of the semiconductor layer 206. The vias 220 and 222 may be formed by forming cavities within the layers of the interposer device 210 (e.g., the insulating layer 208 and the semiconductor layer 206) and by depositing metal within the cavities to form the vias 220 and 222. The cavities may be formed by drilling, by etching, by using a laser, or by another technique to form cavities that extend through one or more portions of one or more layers of the interposer device 210. At least one of the vias may be formed over (e.g., above) a portion of at least one of the metal structures disposed on the substrate 202. For example, the second via 222 may be formed over a portion of the first metal structure 226, and a metal disposed within the second via 222 may be in direct contact with the first metal structure 226.

After the vias are formed, one or more bonding pads may be disposed on a surface of the interposer device 210. For example, one or more bonding pads, including a bonding pad 224, may be disposed (e.g., formed or attached) on a surface of the insulating layer 208 (or a surface of the semiconductor layer 206 in implementations in which the insulating layer 208 is omitted). The bonding pad 224 may include or correspond to the bonding pad 124 of FIG. 1. The one or more bonding pads may be configured to be electrically coupled to another device, such as a semiconductor device or die that is external to the interposer device 210. The one or more bonding pads may be coupled to one or more components of the substrate 202. For example, the bonding pad 224 may be coupled to the first metal structure 226 by the second via 222 (e.g., the second via 222 may be located between the bonding pad 224 and the first metal structure 226, and a metal disposed within the second via 222 may be in direct contact with the bonding pad 224 and with the first metal structure 226). Because the first metal structure 226 is coupled to a metal structure on the opposite side of the substrate 202 by at least one through-substrate via (e.g., the first through-substrate via 213), the bonding pad 224 may provide a connection between a first surface of the interposer device 210 (e.g., a surface of the insulating layer 208) and a second surface of the interposer device (e.g., the second surface 242 of the substrate 202).

After the one or more bonding pads are disposed on the insulating layer 208 (or the semiconductor layer 206 in implementations in which the insulating layer 208 is omitted), the layers 202, 204, 206, and 208 may be diced to form the interposer device 210. For example, the layers 202, 204, 206, and 208 may be diced (e.g., cut) based on design specifications to form the interposer device 210 having target dimensions. To illustrate, after the dicing, the semiconductor layer 206 and the substrate 202 may have at least two dimensions (e.g., length and width) that are substantially equal due to the semiconductor layer 206 and the substrate 202 being diced at the same time and based on the same design specifications.

Referring to FIG. 2G, a seventh illustrative diagram of at least one stage of the process to form the interposer device is shown. The stage illustrated in FIG. 2G may occur after formation of the interposer device 210. As illustrated in FIG. 2G, a semiconductor device 212 may be electrically coupled to the interposer device 210. The semiconductor device 212 may include or correspond to the semiconductor device 112 of FIG. 1. In a particular implementation, the semiconductor device 212 includes an amplifier (e.g., a power amplifier or a low noise amplifier). The semiconductor device 212 may be coupled to the interposer device 210 using one or more metal bumps (or balls) attached to the one or more bonding pads (e.g., the bonding pad 224). Additionally or alternatively, the interposer device 210 may be coupled to a second semiconductor device 250. The second semiconductor device 250 may include a semiconductor die or a semiconductor package. The second semiconductor device 250 may be coupled to the interposer device 210 using one or more metal bumps (or balls) attached to one or more metal structures (e.g., the third metal structure 228 and the fourth metal structure 229) disposed on the second surface 242 of the substrate 202. The interposer device 210 may be configured to enable one or more electrical connections between the semiconductor device 212 and the second semiconductor device 250. For example, one or more vias, one or more metal structures, and one or more through-substrate vias may enable an electrical connection between the semiconductor device 212 and the second semiconductor device 250.

Thus, the process of forming an interposer device described with reference to FIGS. 2A-G forms the interposer device 210. The process reduces (or eliminates) gaps between the semiconductor layer 206 and the dielectric layer 204 by bonding the semiconductor layer 206 to the dielectric layer 204 without using metal bumps (or balls) to connect components of the substrate 202 and the semiconductor layer 206. Reducing (or eliminating) the gaps reduces a thickness of the interposer device 210 and improves connections between layers. Additionally, because the interposer device 210 is formed using a wafer-level process, the layers are bonded before the interposer device 210 is diced, such that at least two dimensions (e.g., length and width) of the layers are the same. Additionally, because at least some vias (e.g., the second via 222 and the first via 220) are formed after the semiconductor layer 206 is bonded to the substrate 202, via mis-alignment is reduced (or eliminated) as compared to forming vias in the layers individually such that the vias are attempted to be aligned before bonding the layers together.

Figure 3:
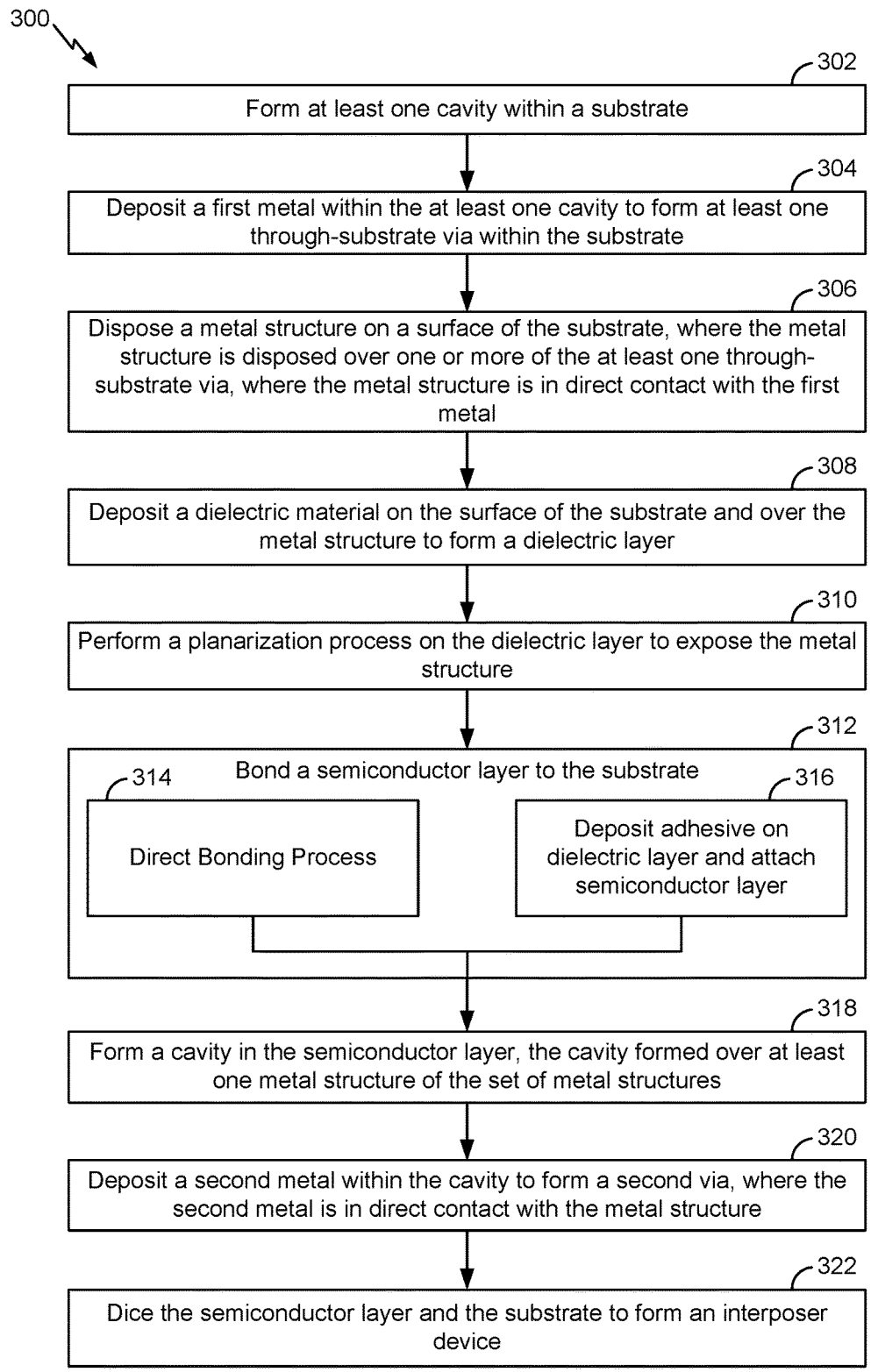
FIG. 3 is a flow chart that illustrates a first illustrative method of forming an interposer device including a semiconductor layer having at least one transistor and including a substrate having at least one through-substrate via.

Referring to FIG. 3, a flow chart of a first illustrative method of forming an interposer device including a semiconductor layer having at least one transistor and including a substrate having at least one through-substrate via is shown and generally designated 300. In a particular implementation, the method 300 may be initiated and/or performed by one or more devices described with reference to FIG. 6.

The method 300 includes forming at least one cavity in a substrate, at 302, and depositing a first metal within the at least one cavity to form at least one through-substrate via within the substrate, at 304. For example, with reference to FIG. 2B, a cavity may be formed within the substrate 202 and a metal may be deposited within the cavity to form the first through-substrate via. The cavity may be formed by etching, by drilling, by using a laser, or by another via-formation technique. The metal may be copper, an alloy, or another metal that is configured to conduct electricity. Depositing the metal in the cavity may form the first through-substrate via 213.

The method 300 includes disposing a metal structure on a surface of the substrate, at 306. The metal structure is disposed (e.g., formed or attached) over (e.g., above) one or more of the at least one through-substrate via, and the metal structure is in direct contact with the first metal. For example, with reference to FIG. 2B, the first metal structure 226 may be disposed over the first through-substrate via 213 on the first surface 240 of the substrate 202.

The method 300 includes depositing a dielectric material on the surface of the substrate and over the metal structure to form a dielectric layer, at 308. For example, with reference to FIG. 2B, a dielectric material may be deposited over the first surface 240 of the substrate 202 and the metal structures 226 and 227 (and the capacitor 218) to form the dielectric layer 204.

The method 300 includes performing a planarization process on the dielectric layer to expose the metal structure, at 310. For example, with reference to FIG. 2C, a planarization process may be performed on the dielectric layer 204 to expose surfaces of the metal structures 226 and 227. After the planarization process, a particular dimension (e.g., a thickness) of the dielectric layer 204 and the metal structures 226 and 227 may be substantially the same.

The method 300 includes bonding a semiconductor layer to the substrate, at 312. The semiconductor layer may include at least one CMOS transistor. In a particular implementation, the bonding includes a direct bonding process, at 314. For example, with reference to FIG. 2D, the semiconductor layer 206 may be pressed against dielectric layer 204, and covalent bonds may form between atoms of the dielectric layer 204 (e.g., a first oxide) and the semiconductor layer 206 (e.g., a second oxide). The covalent bonds may adhere the semiconductor layer 206 to the dielectric layer 204. In another particular implementation, the bonding includes depositing an adhesive on a dielectric layer of the substrate and attaching the semiconductor layer to the adhesive, at 316.

The method 300 includes forming a cavity in the semiconductor layer, at 318, and depositing a second metal within the cavity to form a second via, at 320. The cavity may be formed over at least one metal structure of the set of metal structures, and the second metal may be in direct contact with the metal structure. For example, with reference to FIG. 2F, a cavity may be formed over the first metal structure 226 and a second metal (e.g., copper) may be deposited within the cavity to form the second via 222. The second metal may be in direct contact with the first metal structure 226.

The method 300 further includes dicing the semiconductor layer and the substrate to form an interposer device, at 322. For example, with reference to FIG. 2F, the semiconductor layer 206 and the substrate 202 may be diced to form the interposer device 210.

Thus, the method 300 of FIG. 3 reduces (or eliminates) gaps between a semiconductor layer and a substrate (e.g., a dielectric layer of the substrate) of an interposer device by bonding the semiconductor layer to the substrate without using metal bumps (or balls) to connect components of the substrate to components of the semiconductor layer. Reducing (or eliminating) the gaps reduces a thickness of the interposer device and improves connections between layers. Additionally, because the semiconductor layer includes at least one CMOS transistor, at least some switching functionality is offloaded from a semiconductor device (coupled to the interposer device) to the interposer device, which enables the semiconductor device to have a reduced footprint (e.g., surface area).

Figure 4:
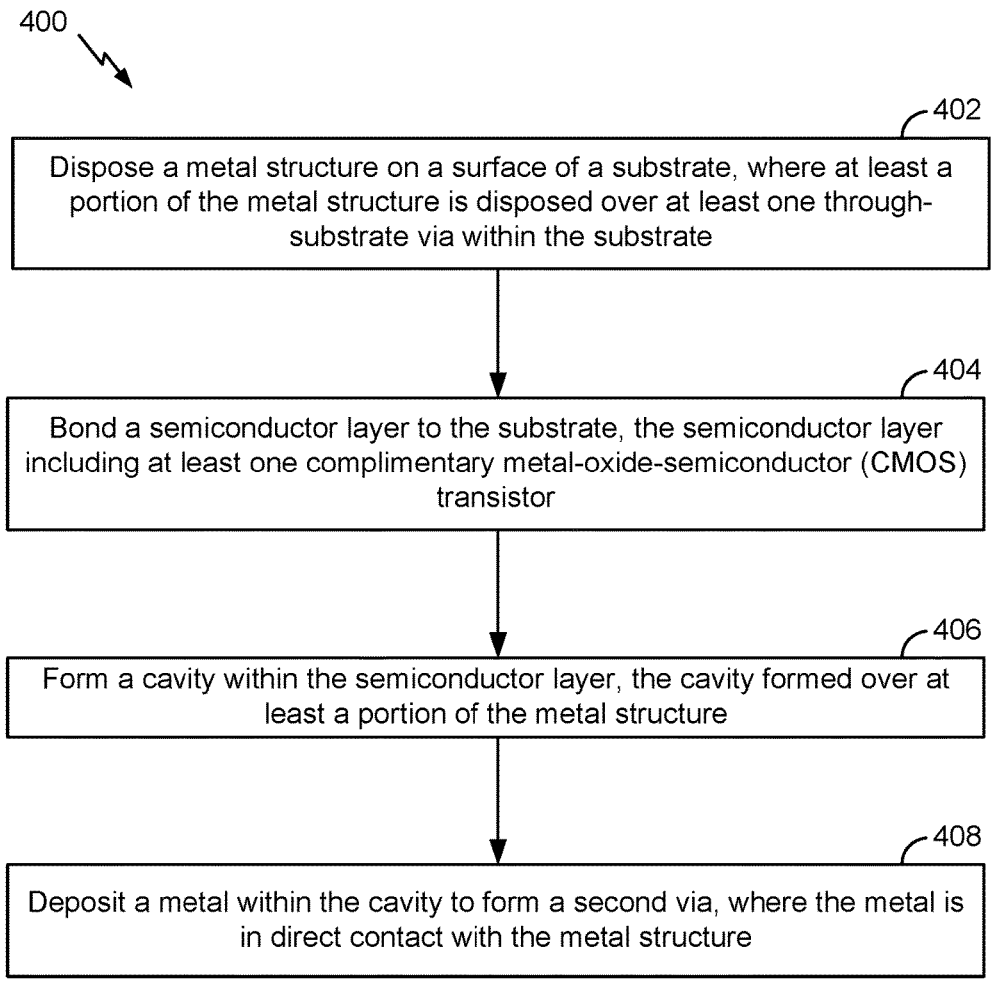
FIG. 4 is a flow chart that illustrates a second illustrative method of forming an interposer device including a semiconductor layer having at least one transistor and including a substrate having at least one through-substrate via.

Referring to FIG. 4, a flow chart of a second illustrative method of forming an interposer device including a semiconductor layer having at least one transistor and including a substrate having at least one through-substrate via is shown and generally designated 400. In a particular implementation, the method 400 may comprise a method of semiconductor fabrication and may be initiated and/or performed by one or more devices described with reference to FIG. 6.

The method 400 includes disposing a metal structure on a surface of a substrate, at 402. At least a portion of the metal structure is disposed over the at least one through-substrate via within the substrate. For example, with reference to FIG. 2B, the first metal structure 226 may be disposed (e.g., formed or attached) on the first surface 240 of the substrate 202 and may be located over the first through-substrate via 213.

The method 400 includes bonding a semiconductor layer to the substrate, at 404. The semiconductor layer may include at least one complimentary metal-oxide-semiconductor (CMOS) transistor. For example, with reference to FIG. 2D, the semiconductor layer 206 may be bonded to the substrate 202 by bonding the semiconductor layer 206 to the dielectric layer 204 of the substrate 202. The semiconductor layer 206 includes the transistor 216 (e.g., at least one CMOS transistor). In a particular implementation, the semiconductor layer 206 is bonded to the substrate 202 using a wafer-level layer transfer process (as compared to a chip-level layer transfer process).

The method 400 further includes forming a cavity within the semiconductor layer, at 406, and depositing a metal within the cavity to form a second via, at 408. The cavity may be formed over at least a portion of the metal structure, and the metal may be in direct contact with the metal structure. For example, with reference to FIG. 2F, a cavity may be formed over the first metal structure 226 and a metal (e.g., copper) may be deposited within the cavity to form the second via 222. The metal within the second via 222 may be in direct contact with the first metal structure 226.

In a particular implementation, the method 400 includes, prior to bonding the semiconductor layer to the substrate, depositing a dielectric material on the surface of the substrate to form a dielectric layer over the metal structure and planarizing the dielectric layer to expose the metal structure. For example, with reference to FIG. 2C, a planarization process may be performed on the dielectric layer 204 to expose surfaces of the metal structures 226 and 227. In this implementation, the dielectric layer may include a first oxide, the semiconductor layer may include a second oxide, and the semiconductor layer may be bonded to the dielectric layer by a process that forms covalent bonds between atoms of the semiconductor layer and the dielectric layer, as described with reference to FIG. 2D. The method 400 may further include, prior to disposing the metal structure, forming at least one cavity within the substrate and depositing a second metal within the at least one cavity to form the at least one through-substrate via. After disposing the metal structure, the metal structure may be in direct contact with the second metal. For example, with reference to FIG. 2B, a cavity may be formed within the substrate 202 and a metal may be deposited within the cavity to form the first through-substrate via 213. Depositing the metal in the cavity may form the first through-substrate via 213, and the first metal structure 226 may be disposed over the first through-substrate via 213 such that the metal disposed within the first through-substrate via 213 is in direct contact with the first metal structure 226.

In another particular implementation, the method 400 includes forming an adhesive layer on at least a portion of the substrate and attaching the adhesive layer to the semiconductor layer. For example, with reference to FIG. 2D, an adhesive may be deposited on the dielectric layer 204 to form an adhesive layer (not shown), and the adhesive layer may be attached to the semiconductor layer 206.

In another particular implementation, the method 400 includes dicing the substrate and the semiconductor layer to form an interposer device. For example, with reference to FIG. 2F, the semiconductor layer 206 and the substrate 202 may be diced to form the interposer device 210. Two dimensions (e.g., length and width) of the semiconductor layer 206 may be the same as two dimensions (e.g., length and width) of the substrate 202 after the semiconductor layer 206 and the substrate 202 are diced.

Thus, the method 400 of FIG. 4 reduces (or eliminates) gaps between a semiconductor layer and a substrate (e.g., a dielectric layer of the substrate) of an interposer device by bonding the semiconductor layer to the substrate without using metal bumps (or balls) to connect components of the substrate to components of the semiconductor layer. Reducing (or eliminating) the gaps reduces a thickness of the interposer device and improves connections between layers. Additionally, because the semiconductor layer includes at least one CMOS transistor, at least some switching functionality is offloaded from a semiconductor device (coupled to the interposer device) to the interposer device, which enables the semiconductor device to have a reduced footprint (e.g., surface area).

Figure 5:
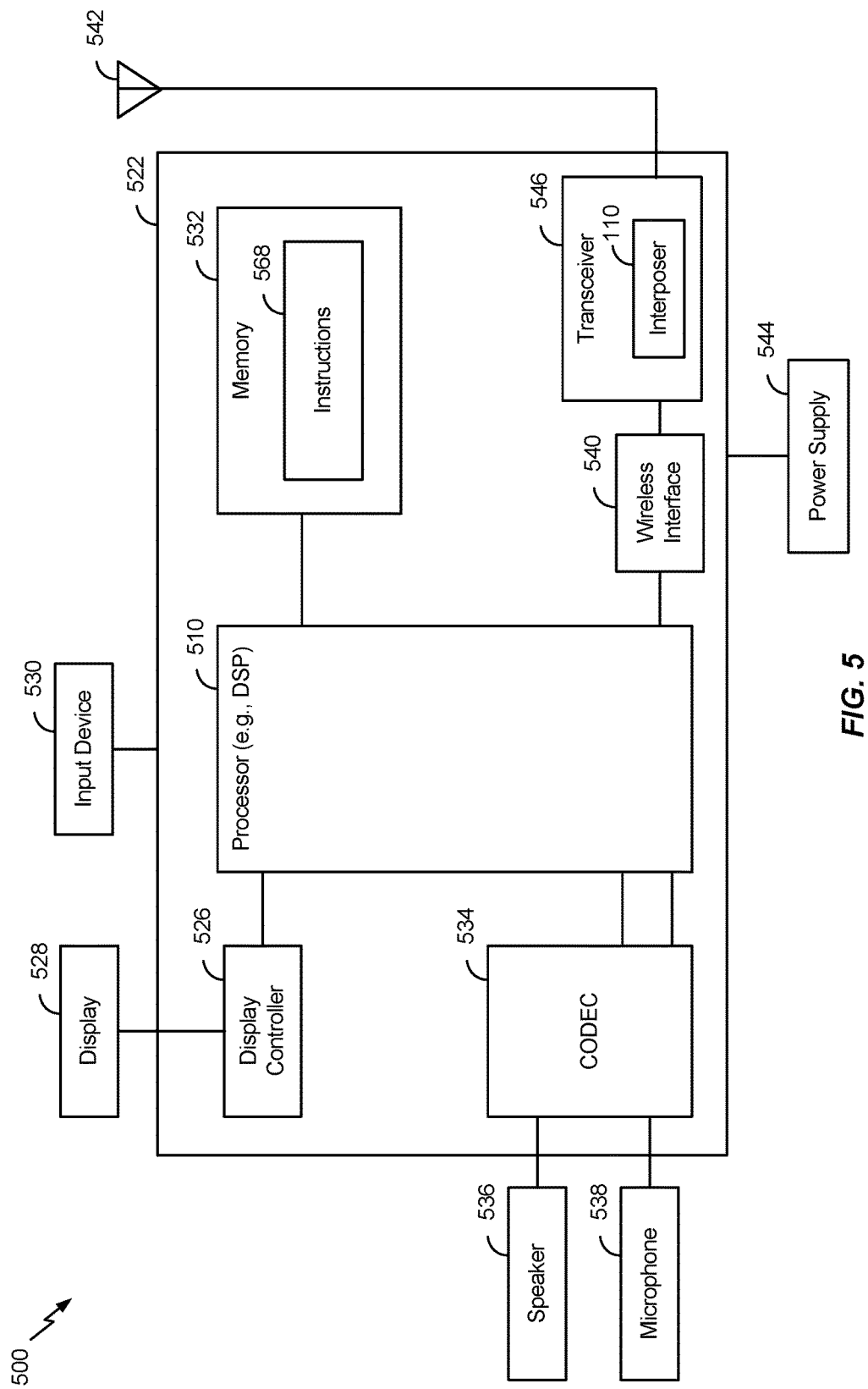
FIG. 5 is a block diagram of a wireless device that includes an interposer device that includes a semiconductor layer having at least one transistor and a substrate having at least one through-substrate via.

Referring to FIG. 5, a block diagram of a particular illustrative implementation of a device (e.g., a wireless communication device) is depicted and generally designated 500. In various implementations, the device 500 may have more or fewer components than illustrated in FIG. 5.

In a particular implementation, the device 500 includes a processor 510, such as a central processing unit (CPU) or a digital signal processor (DSP), coupled to a memory 532. The memory 532 includes instructions 568 (e.g., executable instructions) such as computer-readable instructions or processor-readable instructions. The instructions 568 may include one or more instructions that are executable by a computer, such as the processor 510.

FIG. 5 also illustrates a display controller 526 that is coupled to the processor 510 and to a display 528. A coder/decoder (CODEC) 534 may also be coupled to the processor 510. A speaker 536 and a microphone 538 may be coupled to the CODEC 534.

FIG. 5 also illustrates that a wireless interface 540, such as a wireless controller, and a transceiver 546 may be coupled to the processor 510 and to an antenna 542, such that wireless data received via the antenna 542, the transceiver 546, and the wireless interface 540 may be provided to the processor 510. The transceiver 546 may include the interposer device 110 of FIG. 1. To illustrate, the transceiver 546 may include an interposer device that includes a substrate and a semiconductor layer bonded to the substrate. The substrate may include at least one through-substrate via and a metal structure disposed on a first surface of the substrate. The semiconductor layer may include at least one CMOS transistor and a metal disposed within the via. The metal may be in direct contact with the metal structure.

In some implementations, the processor 510, the display controller 526, the memory 532, the CODEC 534, the interposer device 110, the wireless interface 540, and the transceiver 546 are included in a system-in-package or system-on-chip device 522. In some implementations, an input device 530 and a power supply 544 are coupled to the system-on-chip device 522. Moreover, in a particular implementation, as illustrated in FIG. 5, the display 528, the input device 530, the speaker 536, the microphone 538, the antenna 542, and the power supply 544 are external to the system-on-chip device 522. In a particular implementation, each of the display 528, the input device 530, the speaker 536, the microphone 538, the antenna 542, and the power supply 544 may be coupled to a component of the system-on-chip device 522, such as an interface or a controller.

The device 500 may include a headset, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a component of a vehicle, or any combination thereof.

In an illustrative implementation, the memory 532 includes or stores the instructions 568 (e.g., executable instructions), such as computer-readable instructions or processor-readable instructions. For example, the memory 532 may include or correspond to a non-transitory computer readable medium storing the instructions 568. The instructions 568 may include one or more instructions that are executable by a computer, such as the processor 510.

In conjunction with the described aspects, an apparatus includes means for structurally supporting one or more semiconductor device layers. The means for structurally supporting may include or correspond to the substrate 102 of FIG. 1, the substrate 202 of FIGS. 2A-G, one or more other structures or circuits configured to structurally support one or more semiconductor device layers, or any combination thereof. The means for structurally supporting may include first means for conducting extending through the means for structurally supporting, and second means for conducting may be disposed on a surface of the means for structurally supporting. The first means for conducting may include or correspond to the first through-substrate via 113 of FIG. 1, the first through-substrate via 213 of FIGS. 2B-G, one or more other structures or circuits configured to conduct electricity and that extend through the means for structurally supporting, or any combination thereof. The second means for conducting may include or correspond to the first metal structure 126 of FIG. 1, the first metal structure 226 of FIGS. 2B-G, one or more other structures or circuits configured to conduct electricity, or any combination thereof.

The apparatus further includes means for switching, the means for switching included in a semiconductor layer bonded to the means for structurally supporting. The means for switching may include or correspond to the transistor 116 of FIG. 1, the transistor 216 of FIGS. 2D-G, one or more other structures or circuits configured to enable switching functionality, or any combination thereof. The semiconductor layer may include third means for conducting within the semiconductor layer, and a metal disposed in the third means for conducting may be in direct contact with the second means for conducting. The third means for conducting may include or correspond to the second via 122 of FIG. 1, the second via 222 of FIGS. 2F-G, one or more other structures or circuits configured to conduct electricity, or any combination thereof.

In a particular implementation, the apparatus further includes means for insulating the second means for conducting. The means for insulating may include or correspond to the dielectric layer 104 of FIG. 1, the dielectric layer 204 of FIGS. 2B-2G, one or more other structures or circuits configured to insulate the second means for conducting, or any combination thereof. The means for insulating may be disposed on at least a portion of the surface of the means for structurally supporting. The means for insulating may have substantially the same thickness as the second means for conducting. In another particular implementation, the apparatus further includes means for adhering the semiconductor layer to the means for insulating. The means for adhering may include or correspond to an adhesive layer, one or more other structures or other circuits configured to adhere the semiconductor layer to the means for insulating, or any combination thereof.

One or more of the disclosed aspects may be implemented in a system or an apparatus, such as the device 500, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 500 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, a component integrated within a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

While FIG. 5 illustrates the transceiver 546 as including the interposer device 110, any component of a device, such as the device 500, may include the interposer device 110. For example, the wireless controller 540, the processor 510, the memory 532, the input device 530, the display 528, the display controller 526, or any other electronic device may include the interposer device 110.

While FIG. 5 illustrates a wireless communication device including an interposer device, an interposer device may be included in various other electronic devices. For example, an interposer device as described with references to FIGS. 1-4, may be included in one or more components of a base station.

A base station may be part of a wireless communication system. The wireless communication system may include multiple base stations and multiple wireless devices. The wireless communication system may be a Long Term Evolution (LTE) system, a Code Division Multiple Access (CDMA) system, a Global System for Mobile Communications (GSM) system, a wireless local area network (WLAN)

system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA.

Various functions may be performed by one or more components of the base station, such as sending and receiving messages and data (e.g., audio data). The one or more components of the base station may include a processor (e.g., a CPU), a transcoder, a memory, a network connection, a media gateway, a demodulator, a transmission data processor, a receiver data processor, a transmission multiple input-multiple output (MIMO) processor, transmitters and receivers (e.g., transceivers), an array of antennas, or a combination thereof. One or more of the components of the base station may include an interposer device, as described above with reference to FIGS. 1-4.

During operation of a base station, one or more antennas of the base station may receive a data stream from a wireless device. A transceiver may receive the data stream from the one or more antennas and may provide the data stream to the demodulator. In a particular implementation, the transceiver may include an interposer device, as described above with reference to FIGS. 1-4. The demodulator may demodulate modulated signals of the data stream and provide demodulated data to the receiver data processor. The receiver data processor may extract audio data from the demodulated data and provide the extracted audio data to the processor.

The processor may provide the audio data to the transcoder for transcoding. The decoder of the transcoder may decode the audio data from a first format into decoded audio data and the encoder may encode the decoded audio data into a second format. In some implementations, the encoder may encode the audio data using a higher data rate (e.g., upconvert) or a lower data rate (e.g., downconvert) than received from the wireless device. In other implementations the audio data may not be transcoded. Transcoding operations (e.g., decoding and encoding) may be performed by multiple components of the base station. For example, decoding may be performed by the receiver data processor and encoding may be performed by the transmission data processor. In other implementations, the processor may provide the audio data to the media gateway for conversion to another transmission protocol, coding scheme, or both. The media gateway may provide the converted data to another base station or core network via the network connection.

Figure 6:
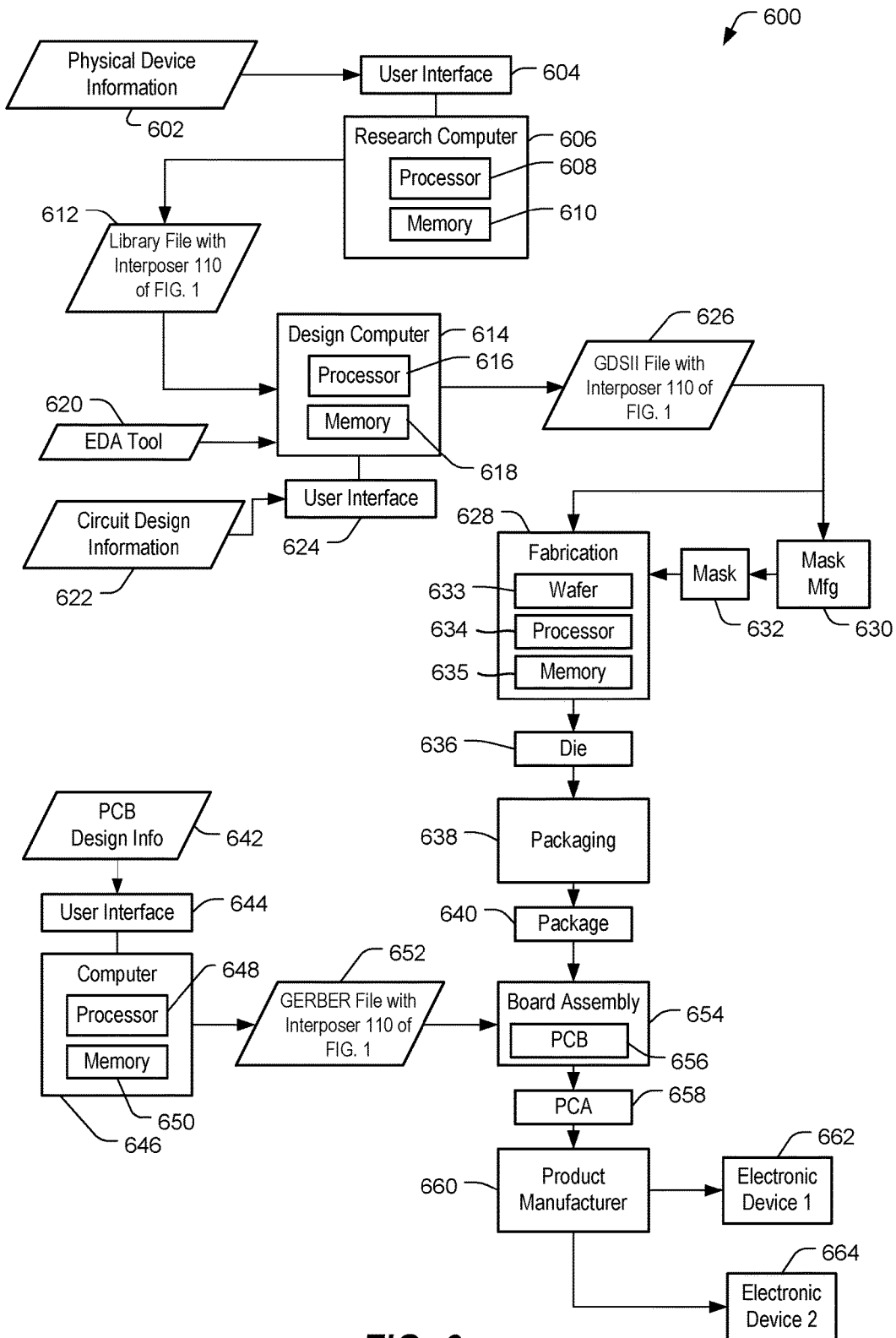
FIG. 6 is a data flow diagram of an illustrative aspect of a manufacturing process to fabricate the interposer device of FIG. 1.

The foregoing disclosed devices and functionalities may be designed and configured into computer files (e.g. RTL, GDSII, GERBER, etc.) stored on computer readable media. Some or all such files may be provided to fabrication handlers to fabricate devices based on such files. Resulting products include semiconductor wafers that are then cut into semiconductor dies and packaged into semiconductor chips. The semiconductor chips are then employed in devices described above. FIG. 6 depicts a particular illustrative implementation of an electronic device manufacturing process 600.

Physical device information 602 is received at the manufacturing process 600, such as at a research computer 606. The physical device information 602 may include design information representing at least one physical property of a semiconductor device, such as the interposer device 110 of FIG. 1. For example, the physical device information 602 may include physical parameters, material characteristics, and structure information that is entered via a user interface 604 coupled to the research computer 606. The research computer 606 includes a processor 608, such as one or more processing cores, coupled to a computer readable medium (e.g., a non-transitory computer readable medium) such as a memory 610. The memory 610 may store computer readable instructions that are executable to cause the processor 608 to transform the physical device information 602 to comply with a file format and to generate a library file 612.

In a particular implementation, the library file 612 includes at least one data file including the transformed design information. For example, the library file 612 may include a library of semiconductor devices including the interposer device 110 of FIG. 1 that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a circuit including the interposer device 110 of FIG. 1 of the library file 612. For example, a user of the design computer 614 may enter circuit design information 622 via a user interface 624 coupled to the design computer 614. The circuit design information 622 may include design information representing at least one physical property of a semiconductor device, such as the interposer device 110 of FIG. 1. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing the interposer device 110 of FIG. 1, in addition to other circuits or information. To illustrate, the data file may include information corresponding to a system-on-chip (SOC) that includes the interposer device 110 of FIG. 1 and that also includes additional electronic circuits and components within the SOC.

The GDSII file 626 may be received at a fabrication process 628 to manufacture the interposer device 110 of FIG. 1, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including the interposer device 110 of FIG. 1.

For example, the fabrication process 628 may include a processor 634 and a memory 635 to initiate and/or control the fabrication process 628. The memory 635 may include executable instructions such as computer-readable instructions or processor-readable instructions. The executable instructions may include one or more instructions that are executable by a computer such as the processor 634.

The fabrication process 628 may be implemented by a fabrication system that is fully automated or partially automated. For example, the fabrication process 628 may be automated according to a schedule. The fabrication system may include fabrication equipment (e.g., processing tools) to perform one or more operations to form a semiconductor device. For example, deposit one or more materials, epitaxially grow one or more materials, conformally deposit one or more materials, apply a hardmask, apply an etching mask, perform etching, perform planarization, form a dummy gate stack, form a gate stack, perform a standard clean 1 type, etc.

The fabrication system (e.g., an automated system that performs the fabrication process 628) may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular aspect, the fabrication system may include multiple processors that are distributed in the fabrication system. For example, a controller of a low-level system component of the fabrication system may include a processor, such as the processor 634.

Alternatively, the processor 634 may be a part of a high-level system, subsystem, or component of the fabrication system. In another aspect, the processor 634 includes distributed processing at various levels and components of a fabrication system.

Thus, the processor 634 may include processor-executable instructions that, when executed by the processor 634, cause the processor 634 to initiate or control formation of an interposer device. In a particular aspect, the processor 634 may perform operations including initiating deposition of a first metal structure on a first surface of a substrate. At least a portion of the metal structure is formed over at least one through-substrate via within the substrate. The operations may include causing a semiconductor layer to be bonded to the substrate. The semiconductor layer may include at least one complimentary metal-oxide-semiconductor (CMOS) transistor. The operations may include initiating formation of a cavity within the semiconductor layer over the metal structure. The operations may further include initiating deposit of a metal within the cavity to form a via. The metal may be in direct contact with the metal structure. One or more of the operations may be performed by controlling one of more deposition tools, such as a molecular beam epitaxial growth tool, a flowable chemical vapor deposition (FCVD) tool, a conformal deposition tool, or a spin-on deposition tool, one or more removal tools, such as a chemical removal tool, a reactive gas removal tool, a hydrogen reaction removal tool, or a standard clean 1 type removal tool, one or more etchers, such as a wet etcher, a dry etcher, or a plasma etcher, one or more dissolving tools, such as a developer or developing tool, one or more layer transfer tools, such as a plasma activation tool or other activation tool, one or more other tools, or a combination thereof.

The executable instructions included in the memory 635 may enable the processor 634 to initiate formation of a semiconductor device such as the interposer device 110 of FIG. 1. In a particular implementation, the memory 635 is a non-transitory computer readable medium storing processor-executable instructions that are executable by the processor 634 to cause the processor 634 to perform the above-described operations.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including the interposer device 110 of FIG. 1.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the interposer device 110 of FIG. 1. In other implementations, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. For example, the first representative electronic device 662, the second representative electronic device 664, or both, may include or correspond to the wireless communication device 500 of FIG. 5. As an illustrative, non-limiting example, the first representative electronic device 662, the second representative electronic device 664, or both, may include or correspond to a communications device, a fixed location data unit, a mobile location data unit, a mobile phone, a cellular phone, a satellite phone, a computer, a tablet, a portable computer, or a desktop computer. Alternatively or additionally, the first representative electronic device 662, the second representative electronic device 664, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a vehicle (or a component thereof), any other device that stores or retrieves data or computer instructions, or a combination thereof, into which the interposer device 110 of FIG. 1 is integrated. As another illustrative, non-limiting example, one or more of the electronic devices 662 and 664 may include remote units, such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 6 illustrates remote units according to teachings of the disclosure, the disclosure is not limited to these illustrated units. Aspects of the disclosure may be suitably employed in any device which includes active integrated circuitry including memory and on-chip circuitry.

A device that includes the interposer device 110 of FIG. 1 may be fabricated, processed, and incorporated into an electronic device, as described in the illustrative process 600. One or more aspects disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical implementations such as the mask 632, the die 636, the package 640, the PCA 658, other products such as prototype circuits or devices (not shown), or any combination thereof. Although various representative stages are depicted with reference to FIGS. 1-6, in other implementations fewer stages may be used or additional stages may be included. Similarly, the process 600 of FIG. 6 may be performed by a single entity or by one or more entities performing various stages of the process 600.

Although one or more of FIGS. 1-6 may illustrate systems, apparatuses, and/or methods according to the teachings of the disclosure, the disclosure is not limited to these illustrated systems, apparatuses, and/or methods. One or more functions or components of any of FIGS. 1-6 as illustrated or described herein may be combined with one or more other portions of another of FIGS. 1-6. For example, one or more steps of the method 300 of FIG. 3 may be performed in combination with the method 400 of FIG. 4. Accordingly, no single implementation described herein should be construed as limiting and implementations of the disclosure may be suitably combined without departing form the teachings of the disclosure. As an example, one or more operations described with reference to FIGS. 3 and 4 may be optional, may be performed at least partially concurrently, and/or may be performed in a different order than shown or described.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:
1. A device comprising:
 a substrate including at least one through-substrate via;
 a metal structure disposed on a surface of the substrate, wherein the surface of the substrate and a first surface of the at least one through-substrate via are in direct contact with a first surface of the metal structure;
 a semiconductor layer bonded to the substrate, the semiconductor layer including:
  at least one complimentary metal-oxide-semiconductor (CMOS) transistor; and
  a metal disposed within a second via, the metal in direct contact with the metal structure, the second via intersecting a surface of the semiconductor layer and the metal in direct contact with a second surface of the metal structure, and the at least one CMOS transistor coupled to a bonding pad by a third via, the bonding pad coupled to the metal structure by the second via;
 a second metal disposed within the at least one through-substrate via in direct contact with the first surface of the metal structure; and
 a second metal structure disposed on a second surface of the substrate, an interface between a surface of the second metal structure and the at least one through-substrate via in direct contact with the second surface of the substrate.

2. The device of claim 1, further comprising one or more dielectric portions disposed on the surface of the substrate, wherein a thickness of the one or more dielectric portions is substantially the same as a thickness of the metal structure, and wherein the one or more dielectric portions are in direct contact with the surface of the substrate.

3. The device of claim 2, wherein at least a portion of the surface of the semiconductor layer is in direct contact with the one or more dielectric portions, and wherein the metal and the surface of the semiconductor layer are in direct contact with a same second surface of the metal structure that is opposite and facing to the surface of the substrate.

4. The device of claim 2, wherein the one or more dielectric portions comprise silicon dioxide, and wherein the semiconductor layer comprises silicon dioxide.

5. The device of claim 1, wherein the metal structure is disposed on the surface of the substrate that is nearest to the semiconductor layer, and further comprising an adhesive layer disposed between the substrate and the semiconductor layer.

6. The device of claim 1, further comprising:
an insulating layer disposed on the semiconductor layer; and
at least one bonding pad disposed on the insulating layer and configured to be coupled to a semiconductor device, the semiconductor layer including the third via.

7. The device of claim 6, wherein the second via intersects a second surface of the semiconductor layer, the second surface of the semiconductor layer opposite a first surface of the semiconductor layer, the first surface of the semiconductor layer in contact with the metal structure.

8. The device of claim 6, wherein the second via extends from the at least one bonding pad through the insulating layer and the semiconductor layer to the metal structure.

9. The device of claim 6, wherein the second metal structure is coupled to the metal structure by a first through-substrate via of the at least one through-substrate via, wherein a third metal structure is disposed on the surface of the substrate and coupled to the second metal structure by a second through-substrate via of the at least one through-substrate via, and wherein an inductor comprises the metal structure, the first through-substrate via, the second metal structure, the second through-substrate via, and the third metal structure.

10. The device of claim 9, further comprising a filter including the inductor and at least one capacitor, the at least one capacitor disposed on the surface of the substrate and coupled to the inductor.

11. The device of claim 1, wherein the substrate comprises a glass substrate, and wherein the at least one through-substrate via comprises at least one through-glass via (TGV).

12. The device of claim 1, wherein the substrate comprises a silicon substrate, and wherein the at least one through-substrate via comprises at least one through-silicon via (TSV).

13. The device of claim 1, wherein the substrate comprises a laminate substrate, and wherein the at least one through-substrate via comprises at least one through-laminate via.

14. The device of claim 1, wherein the substrate and the semiconductor layer are integrated in a transceiver, and wherein the transceiver is included in a mobile device.

15. The device of claim 1, wherein the substrate and the semiconductor layer are integrated in a transceiver, and wherein the transceiver is included in a base station.

16. A method of semiconductor fabrication, the method comprising:
disposing a metal structure on a surface of a substrate, wherein at least a portion of the metal structure is disposed over at least one through-substrate via within the substrate, and wherein the surface of the substrate and a first surface of the at least one through-substrate via are in direct contact with a first surface of the metal structure;
bonding a semiconductor layer to the substrate using a wafer-level layer transfer process, the semiconductor layer including at least one complimentary metal-oxide-semiconductor (CMOS) transistor;
forming a cavity within the semiconductor layer, the cavity formed over at least a portion of the metal structure;
depositing a metal within the cavity to form a second via, the second via intersects a surface of the semiconductor layer, wherein the metal is in direct contact with the metal structure;
forming at least one via through the semiconductor layer and the substrate during a single process; and
after formation of the at least one via, dicing the substrate and the semiconductor layer to form an interposer device.

17. The method of claim 16, wherein bonding the semiconductor layer to the substrate comprises:
forming an adhesive layer on at least a portion of the substrate; and
attaching the adhesive layer to the semiconductor layer.

18. A method of semiconductor fabrication, the method comprising:
disposing a metal structure on a surface of a substrate, wherein at least a portion of the metal structure is disposed over at least one through-substrate via within the substrate, and wherein the surface of the substrate and a first surface of the at least one through-substrate via are in direct contact with a first surface of the metal structure;
bonding a semiconductor layer to the substrate, the semiconductor layer including at least one complimentary metal-oxide-semiconductor (CMOS) transistor;
forming a cavity within the semiconductor layer, the cavity formed over at least a portion of the metal structure;
depositing a metal within the cavity to form a second via, the second via intersects a surface of the semiconductor layer, wherein the metal is in direct contact with the metal structure; and
prior to bonding the semiconductor layer to the substrate, depositing a dielectric material on the surface of the substrate to form a dielectric layer over the metal structure and planarizing the dielectric layer to expose the metal structure, wherein the dielectric material directly contacts a portion of the surface of the substrate.

19. The method of claim 18, wherein the dielectric layer comprises a first oxide, wherein the semiconductor layer comprises a second oxide, and wherein the semiconductor layer is bonded to the dielectric layer by a process that forms covalent bonds between atoms of the semiconductor layer and the dielectric layer.

20. The method of claim 18, further comprising, prior to disposing the metal structure, forming at least one cavity within the substrate and depositing a second metal within the at least one cavity to form the at least one through-substrate via, wherein, after disposing the metal structure, the metal structure is in direct contact with the second metal.

21. An apparatus comprising:
- means for structurally supporting one or more semiconductor device layers, the means for structurally supporting including first means for conducting extending through the means for structurally supporting, wherein second means for conducting is disposed on a surface of the means for structurally supporting, and wherein the surface of the means for structurally supporting and a first surface of the first means for conducting are in direct contact with a first surface of the second means for conducting;
- means for switching, the means for switching included in a semiconductor layer bonded to the means for structurally supporting, wherein the semiconductor layer includes third means for conducting within the semiconductor layer, the third means for conducting intersects a surface of the semiconductor layer, and wherein a metal disposed in the third means for conducting is in direct contact with the second means for conducting;
- means for insulating the second means for conducting, wherein the means for insulating is disposed on at least a portion of the surface of the means for structurally supporting; and
- an adhesive layer disposed between the semiconductor layer and the means for insulating.

22. The apparatus of claim 21, wherein the means for insulating has substantially the same thickness as the second means for conducting.

\* \* \* \* \*